(12) United States Patent
Kudo et al.

(10) Patent No.: US 8,457,168 B2
(45) Date of Patent: Jun. 4, 2013

(54) SEMICONDUCTOR LASER, MODULE AND OPTICAL TRANSMITTER

(75) Inventors: Koji Kudo, Tokyo (JP); Shinya Sudo, Tokyo (JP); Kenji Sato, Tokyo (JP); Kenji Mizutani, Tokyo (JP)

(73) Assignee: NEC Corporation, Tokyo (JP)

( * ) Notice: Subject to any disclaimer, the term of this patent is extended or adjusted under 35 U.S.C. 154(b) by 209 days.

(21) Appl. No.: 12/086,287

(22) PCT Filed: Jan. 10, 2007

(86) PCT No.: PCT/JP2007/050168
§ 371 (c)(1),
(2), (4) Date: Jul. 15, 2008

(87) PCT Pub. No.: WO2007/080891
PCT Pub. Date: Jul. 19, 2007

(65) Prior Publication Data
US 2009/0274187 A1 Nov. 5, 2009

(30) Foreign Application Priority Data
Jan. 11, 2006 (JP) ................................. 2006-003903

(51) Int. Cl.
*H01S 5/00* (2006.01)

(52) U.S. Cl.
USPC ................ 372/50.1; 372/50.22; 372/46.014

(58) Field of Classification Search
USPC ................. 372/50.1, 50.22, 46.014
See application file for complete search history.

(56) References Cited

U.S. PATENT DOCUMENTS

| 5,914,977 A * | 6/1999 | Mukaihara et al. ........ 372/50.21 |
| 6,163,631 A | 12/2000 | Kawanishi et al. |
| 6,295,308 B1 | 9/2001 | Zah |
| 6,340,605 B1 | 1/2002 | Kawanishi et al. |
| 2003/0091086 A1* | 5/2003 | Sahara et al. .................. 372/50 |
| 2003/0142702 A1* | 7/2003 | Pontis et al. .................. 372/20 |
| 2004/0114871 A1 | 6/2004 | Cho et al. |
| 2004/0136414 A1 | 7/2004 | Matsumoto et al. |
| 2006/0088066 A1* | 4/2006 | He ................................ 372/10 |
| 2006/0140228 A1* | 6/2006 | McDonald et al. ............ 372/20 |

FOREIGN PATENT DOCUMENTS

| JP | 06-163874 | 6/1994 |
| JP | 07-020359 | 1/1995 |
| JP | 10-125989 | 5/1998 |
| JP | 11-014842 | 1/1999 |
| JP | 2002-111129 A | 4/2002 |
| JP | 2003-508927 A | 3/2003 |
| JP | 2004-200697 A | 7/2004 |
| JP | 2004-221321 A | 8/2004 |

* cited by examiner

*Primary Examiner* — Tod T Van Roy
(74) *Attorney, Agent, or Firm* — Foley & Lardner LLP

(57) ABSTRACT

A semiconductor optical waveguide-A having an optical amplification function and a semiconductor optical waveguide-B having a light control function are integrated together on the same substrate. A facet of the semiconductor optical waveguide-A facing an isolation trench and a facet of the semiconductor optical waveguide-B facing the isolation trench are configured as a composite optical reflector/optical connector using an optical interference. The facet of the semiconductor optical waveguide-A achieves an optical reflectivity not higher than the reflectivity corresponding to a cleaved facet and not smaller than several percent, and an optical coupling coefficient of not lower than 50% between the semiconductor optical waveguide-A and the semiconductor optical waveguide-B.

15 Claims, 15 Drawing Sheets

$$C_{VOA} = \frac{P_{out}}{P_{in} \times (1 - R_{f\_SOA})} \times 100$$

SEMICONDUCTOR LASER, MODULE AND OPTICAL TRANSMITTER

This application is the National Phase of PCT/JP2007/050168, filed Jan. 10, 2007, which claims priority to Japanese Application No. 2006-003903, filed Jan. 11, 2006, the disclosures of which are hereby incorporated by reference in their entirety.

TECHNICAL FIELD

The present invention relates to a semiconductor laser, a module and an optical transmitter and, more particularly, to a semiconductor laser wherein semiconductor optical waveguides disposed in respective different functional regions are integrated together with an intervention of an isolation trench, and to a semiconductor laser module and an optical transmitter including such a semiconductor laser.

BACKGROUND ART

External resonance-type semiconductor lasers include one that includes therein an optical reflector, wavelength filter, and a semiconductor optical component having an optical amplification function and formed on a semiconductor substrate, and uses a cleaved facet of the semiconductor optical component as a reflector for configuring a resonator. In order to afford another function, such as an optical modulation function, to the semiconductor laser, an optical modulator should be separately mounted thereon in some form. There are roughly two techniques for mounting an external optical modulator. In one configuration, as shown in FIG. 18, an optical modulator 211, such as LN modulator or semiconductor optical modulator, is separately prepared, and optically coupled to a laser resonator 220, which includes a semiconductor optical amplifier 203, a lens 206, a wavelength filter 202, and an optical reflector 201, via an optical component such as a lens in a module, thereby allowing the module to have an optical modulation function as a whole. The optical modulator 211 is coupled to an optical fiber in the module via an optical isolator 207. In the other configuration, as shown in FIG. 19, an optical modulator module 214 is separately prepared, and the optical output of a semiconductor laser module 213 is guided to the optical modulator module 214 via an optical fiber, to thereby provide an optical modulation function on a board.

However, the configuration wherein the module is provided with the optical modulation function, as shown in FIG. 18, increases the number of components in the module to incur a cost increase. In addition, the complicated configuration in the module increases the man-hour of the assembly and decreases the throughput. Further, there also arises the problem of an increased size of the module. The configuration shown in FIG. 19, wherein the optical modulation function is provided on the board, necessitates provision of the optical modulator module and the semiconductor laser module separately, thereby incurring problems such as a cost increase and a larger occupied area of the modules on the mounting board. For solving those problems, it is desired that an optical reflector mechanism corresponding to a cleaved facet be formed on the semiconductor substrate, and the optical modulator is monolithically integrated on the same substrate.

PCT Patent Publication JP-2003-508927A describes the configuration wherein an optical modulator is monolithically integrated on a semiconductor substrate in an external resonance-type semiconductor laser. In JP-2003-508927A, a partial reflector is configured on a substrate including a semiconductor component having an amplifying function of light, and the optical modulator, is monolithically integrated thereon. In this publication, the partial reflectors proposed therein include:

1) etched facet;
2) loop mirror; and
3) distributed Bragg reflector (DBR).

In particular, if it is intended to replace the cleaved facet (facet obtained by cleavage) by the reflector, the etched facet shown in item 1) offers a promising prospect.

A variety of reports have been provided heretofore as to the integrated structure using the etched facet. Examples of the structure include one using an etched trench as a filter, and another using the etched facet as a reflector. Among those structures, the structure focusing on "raising the reflectivity" has been reported in a number of proposals. For example, Patent Publication JP-1998-125989A describes a multilayer reflector mirror including low-refractive-index/high-refractive-index layers, and that "more than two layers" employed achieve a reflectivity as high as around 92%. In JP-1998-125989A, it is recited that this configuration realizes a semiconductor laser having a lower threshold current. It is also proposed that the semiconductor laser having a lower threshold current be integrated with another functional region.

Contrary to JP-1998-125989A, a structure focusing on "decreasing the reflectivity" is also reported. Examples of the report include JP-1999-14842A, wherein an isolation trench is formed on a semiconductor substrate by etching, and a semiconductor layer having a refractive index equivalent to the refractive index of the semiconductor substrate is embedded in the isolation trench, thereby suppressing the reflectivity at the interface which originally configures the facet part. JP-1995-20359A recites a configuration wherein an isolation trench is formed, an optical spot incident onto the trench has a spot size as larger as 5 μm, and the facet is bent by around 10° whereby the attenuation amount of the reflection is 50 dB or above, with the reflectivity of an ordinary vertical facet being a unit.

A structure focusing on "decreasing the optical coupling coefficient" as to the integrated structure using the etched facet is also reported. Examples of the report include JP-2004-200697A, wherein an isolation trench is referred to as inner window, and a larger distance for the isolation trench is employed, to thereby achieve a drastic decrease in the optical coupling coefficient between the regions isolated from one another by the isolation trench and having different functions. JP-2004-221321A describes a structure wherein two functional regions are simply isolated from one another.

It is desired in a semiconductor laser, wherein an optical modulator is monolithically integrated via an isolation trench on a semiconductor substrate and an optical reflection mechanism corresponding to the cleaved facet is formed on the semiconductor substrate, that the optical reflection mechanism have a suitable reflectivity not higher than around 30% (corresponding to that of facet) and not lower than several percent for achieving a higher-laser-efficiency operation and that the optical connection mechanism have as high an optical coupling coefficient as possible, such as 50% or above, in order for achieving a sufficient level of the optical output power of the optical modulator. However, JP-2003-508927A only describes that an etched facet is used, and thus it is not clear whether or not the above suitable reflectivity and high optical efficiency can be obtained. JP-1998-125989A pursues a reflectivity of 90% or above, which is too high to achieve the above suitable reflectivity and high coupling coefficient, and thus the targeted reflectivity and high optical coupling coefficient cannot be obtained.

In JP-1999-14842A and JP-1995-20359A, reduction of the reflectivity is focused and the interface part (facet part) has a reflectivity of substantially zero. Accordingly, it is almost impossible to achieve the above suitable optical reflectivity and high optical coupling coefficient. Although an example of butt-joint between an optical coupler/splitter using a quartz-based PLC and a semiconductor laser is also reported, even in such a case, coating with a refractive-index matching gel or forming an AR film for antireflection on the facet is used in order for suppressing the reflection between those devices as much as possible, and thus the technological orientation thereof is directed to suppressing the refection as much as possible. In JP-2004-200697A, the optical coupling coefficient is lowered for optical isolation, and thus unable to obtain the suitable optical reflectivity and higher optical coupling coefficient, especially unable to obtain the latter. JP-2004-221321A proposes only the structure for isolation between the two functional regions, and thus there is a lower possibility of achieving the above suitable reflectivity and higher optical coupling coefficient.

As described heretofore, the semiconductor laser of conventional techniques including an optical reflector, a wavelength filter, and a semiconductor optical component formed on a semiconductor substrate and using the facet of the semiconductor component as an optical reflector configuring the resonator fails to achieve the structure that provides a facet optical reflector in the semiconductor optical component having the suitable reflectivity, which is not higher than around 30% (corresponding to that of the cleaved facet) and not lower than several percent, and provides an optical coupling coefficient not lower than 50% and as high as possible.

SUMMARY OF THE INVENTION

It is an object of the present invention to provide a semiconductor laser which includes an optical reflector, a wavelength filter and a semiconductor optical component formed on a semiconductor substrate and having an optical amplification function, wherein the semiconductor laser includes a facet of the semiconductor optical component as a reflector having a suitable reflectivity not lower than around 30% (corresponding to that of a cleaved facet) and not higher than several percent and providing an optical coupling coefficient not lower than 50% and as high as possible, and an optical coupler between different functional regions, and to provide a semiconductor module and a transmitter including such a semiconductor laser.

The present invention provides a semiconductor laser including first and second semiconductor optical waveguides formed on a semiconductor substrate and isolated from each other by an isolation trench, wherein: a pair of facets including one of facets of the first semiconductor optical waveguide adjacent to the isolation trench and a facet of the second semiconductor optical waveguide opposing the one of the facets configures a composite optical reflector/connector.

In the semiconductor laser of the present invention, the facet of first semiconductor optical waveguide and the facet of second semiconductor optical waveguide which oppose each other with an intervention of the isolation trench are used as a composite optical reflector/connector. Use of the facets formed by the isolation trench as a composite optical reflector/connector using an optical interference achieves a superior characteristic, i.e., an effective reflectivity Rf_SOA not higher than 30% (corresponding to that of a cleaved facet) and not lower than 1% as viewed from the first optical waveguide to the isolation trench, and at the same time achieves an optical coupling coefficient CVOA not lower than 50% from the first semiconductor optical waveguide to the second semiconductor optical waveguide, thereby providing a higher-efficient semiconductor laser.

The present invention provides an optical transmitter including, the above semiconductor laser of the present invention. The present invention also provides a semiconductor laser module including the above semiconductor laser of the present invention and a waveguide locker unit. The present invention further provides an optical transmitter including the above semiconductor laser module of the present invention.

The above and other objects and advantages of the present invention will be more apparent from the following description, referring to the accompanying drawings.

BEST MODE OF CARRYING OUT THE INVENTION

Figure 1A:
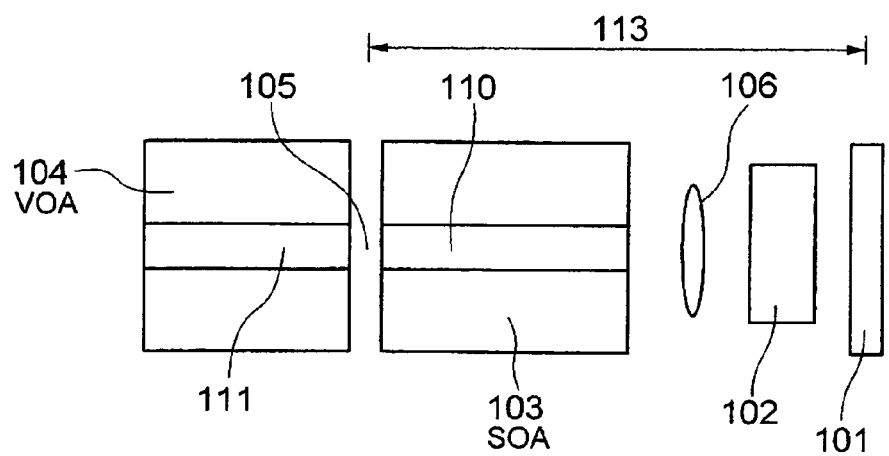
FIG. 1A is a schematic top plan view showing a model of the basic structure of an external resonance-type semiconductor laser.

Before describing exemplary embodiments, the structure of an optical reflector which achieves both the suitable optical reflectivity and appropriate optical coupling coefficient will be discussed hereinafter, with respect to a semiconductor laser wherein the facet of a semiconductor optical component formed on a semiconductor substrate is used as the optical reflector configuring an optical resonator. Conventionally, an integrated optical device including different regions coupled together with an intervention of "a single gap" is directed to the structure wherein a light reflected from the opposing surface that opposes with an intervention of the gap (trench), that is, a reflected return light is to be suppressed as much as possible. In addition, if there is no citation as to suppression of the reflected return light, the discussion therein premises that there is no reflected return light from the opposing surface. This may be a discussion focused on the propagation and coupling of the light in the state thereof without an interaction between the different regions, and thus it is considered necessary to assure the independency of the respective regions that are integrated together with an intervention of the gap. Background of this discussion is such that the reflected return light from the opposing surface in the above integrated optical device has been considered a disturbance factor which originally should not exist, and thus the reflected return light has been treated in a "reflected return light problem" and treated as a target to be avoided completely at any time. Therefore, in the integrated optical device including therein different regions integrated, if the highest characteristic obtained in the respective regions is to be discussed, there is a common sense that influence by the reflected return light from the facet causing a characteristic degradation is disregarded, and discussion is held under an "ideal condition" in a sense.

On the other hand, if "a plurality of gaps" are formed in sequence, such a structure is referred to as "diffraction grating", wherein the reflected light from a plurality of reflecting surfaces are utilized positively and effectively, while recognizing the feature of the reflector having a higher reflectivity, contrary to the above case. In this case, the base of this idea resides on utilization of "Bragg reflection" of a diffraction grating, and the trench structure is substantially specifically determined, such as by determining the order, of the Bragg reflection and central Bragg wavelength, whereby the width of trench is equal to the period of diffraction grating, for example. In such a case, in order to obtain a higher reflectivity within a narrow wavelength range including therein the Bragg wavelength at the center, it is considered desirable that the width of trench be reduced to as narrow as possible while satisfying the Bragg condition.

However, in a semiconductor laser device wherein a semiconductor laser including a first optical reflector (optical reflector-A), a wavelength filter, a semiconductor optical waveguide (semiconductor optical waveguide-A) having at least an optical amplification function and formed on a semiconductor substrate, and a second optical reflector (optical reflector-B) is coupled with another semiconductor waveguide (semiconductor waveguide-V) having a different function, it is desired that optical reflector-B be a reflector having no wavelength dependency corresponding to that of the cleaved facet and that the number of reflecting surfaces be smaller for achieving the non-wavelength dependency in the reflection characteristic thereof. Thus, the present invention notices the structure of reflector-B having only a single gap. However, the present invention notices in this case a positive utilization of the reflected light from the opposing surface, contrary to the conventional techniques.

If there is only a single gap present, the gap cannot be referred to as an ideal diffraction grating in the conventional technique. Thus, the gap is not suitable to provide a higher reflectivity using multiple reflection, is regarded as a mere isolation structure for integrated components, and the optical reflection from the opposing surface should be considered as a target for countermeasure of avoiding the influence thereof as much as possible. The technical idea as to the countermeasure against the reflected return light etc. which have been long discussed from a historic age corresponds to this example. However, the present invention positively utilizes the reflected light from the opposing surface, to achieve a suitable reflectivity on the side of semiconductor optical waveguide-A, and found a structure having a higher product yield wherein the light emitted from semiconductor optical waveguide-A is incident with a higher coupling coefficient onto semiconductor optical waveguide-B integrated therewith and having a different function. More specifically, the present invention found that in the structure wherein semiconductor optical waveguide-A formed on a semiconductor substrate and semiconductor optical waveguide-B are integrated with each other with an intervention of an isolation trench, the isolation trench has a surface-a on the side of semiconductor optical waveguide-A and a surface-b on the side of semiconductor optical waveguide-B, which oppose each other with an isolation length of dGap, by allowing this portion of the isolation trench to have a suitable structure, a configuration is obtained wherein surface-a and surface-b configure a composite reflector which is suitable as an optical reflector for the semiconductor laser, and wherein the composite reflector functions as a higher-efficient optical connector for semiconductor optical waveguide-B configured as another functional region integrated. The composite optical reflector/connector configured by the above isolation trench achieves: (1) a suitable reflectivity not higher than around 30% (corresponding to that of a cleaved facet) and not lower than several percent, such as 1% or above, as an optical reflection mechanism; and at the same time, (2) an optical coupling coefficient not lower than 50% as an optical connection mechanism. Such a composite optical reflector/connector can be realized by the structure wherein the light emitted from semiconductor optical waveguide-A through surface-a is reflected by surface-b so that the emitted light from surface-a and the reflected light from surface-b interfere with each other, surface-a and surface-b opposing each other with an isolation distance dGap. For this purpose, at least the isolation distance dGap should be set at a "suitable distance" which is not larger than an "interference-enabling distance" within which emitted lights interfere with each other, and at the same time, surface-a and surface-b should have a suitable shape. Now, the structural conditions needed to configure the composite optical reflector/connector will be described in detail with reference to the drawings. Similar constituent elements are shown as designated at similar reference numerals throughout the drawings for a better understanding.

Figure 1B:
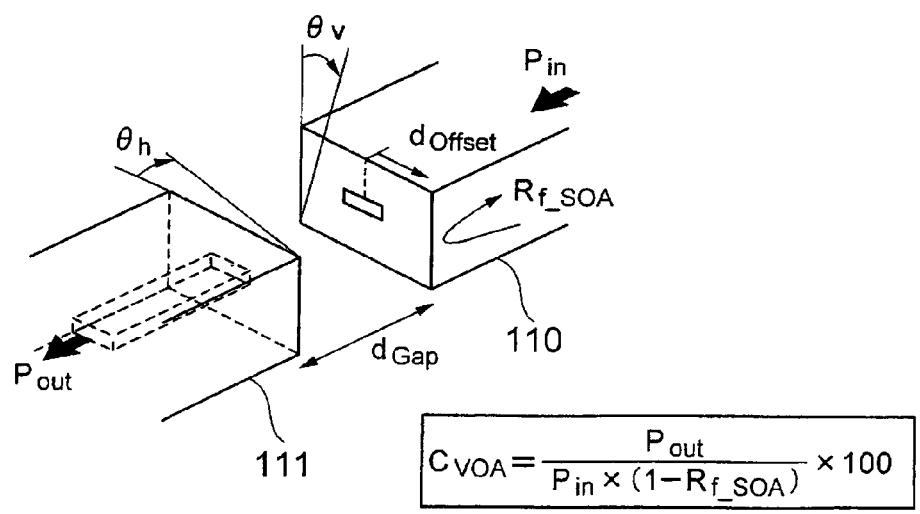
FIG. 1B is an enlarged perspective view showing the vicinity of semiconductor optical waveguides opposing each other with an intervention of an isolation trench in the model.

FIG. 1A is a schematic top plan view of a model of the structure of an external resonance-type semiconductor laser, and FIG. 1B is an enlarged perspective view showing the vicinity of semiconductor optical waveguides opposing each other with an intervention of an isolation trench. This model premises the configuration including a semiconductor optical waveguide-A 110 provided on the side of a SOA (semiconductor optical amplifier) region 103, a light-emitting facet thereof, a gap, a semiconductor optical waveguide-B 111 provided on the side of a VOA (variable optical attenuator) region 104 integrated with the SOA region 103 on the same semiconductor substrate, and a light-incident facet thereof. The VOA (variable optical attenuator) region 104 may be replaced by a MOD (modulator) region.

More specifically, the above model is comprised of waveguide-B 111 disposed adjacent to the VOA 104, an isolation trench (gap) 105, waveguide-A 110 disposed adjacent to the SOA, a lens 106, a wavelength filter 102, and an optical reflector 101, wherein the SOA 103 including waveguide-A 110, lens 106, wavelength filter 102 and optical reflector 101 configure a laser resonator 113.

Here, four parameters are considered as main parameters which affect the enabling of interference in the above model, as follows:

(1) gap distance (dGap);
(2) bent angle (θ h) of waveguide with respect to horizontal direction;
(3) horizontal position offset (doffset) between SOA waveguide and VOA waveguide; and
(4) width of input/output optical waveguide (relating to the spot size of light at emitting/receiving part to the gap).

The indexes showing the characteristics of composite optical reflector/connector and used herein include an effective front-facet reflectivity Rf_SOA on the side of SOA region 103, and the coupling coefficient CVOA of light from semiconductor optical waveguide-A 110 on the side of SOA region 103 to semiconductor optical waveguide-B 111 on the side of VOA region 104. The CVOA is defined by the following formula (1):

$$C_{VOA}[\%] = \frac{Pout}{Pin \times (1 - R_{f\_SOA})} \times 100 \qquad (1)$$

The formula (1) expresses what percent of the total light is coupled to the fundamental mode of semiconductor optical waveguide-B 111, assuming that the total light Pin emitted from semiconductor optical waveguide-A 110 except for the light reflected "by the composite optical reflector" with the effective SOA-front-facet reflectivity Rf_SOA is 100% (denominator). If there is no loss accompanying radiation, the numerator is equal to the denominator whereby the CVOA assumes 100%.

Although there is another parameter as the bent angle θ v of waveguide bent with respect to the vertical direction, as shown in FIG. 1B, the following investigation premises θ v=0° because it is desirable that the inclination be as small as possible in order for obtaining the interference effect. In addition, the discussion assumes that there is no deviation in the vertical position between the waveguides. This is because it is considered that the deviation in the vertical position can be substantially neglected if fabrication of the device uses a crystal growth etc. for forming semiconductor optical waveguide-A 110 and semiconductor optical waveguide-B 111 on the same substrate.

[Influence of Gap (Trench) Distance dGap]

To begin with, a gap distance (dGap) dependency of the Rf_SOA was analytically investigated in order to recognize the enabling of interference. This analysis assumed the gap medium being air (refractive index nGap, nGap=1), a perfect vertical facet (θ v=θ h=0), and the relative deviation between semiconductor optical waveguide-A 110 and semiconductor optical waveguide-B 111 being zero (doffset=0), and used an incident wavelength of 1.55 μm. The optical waveguide width of both semiconductor optical waveguide-A 110 and semiconductor optical waveguide-B 111 was around 1.5 μm, and the optical spot size at the emitting/incident facet of the trench part was around 2 μm.

Figure 2:
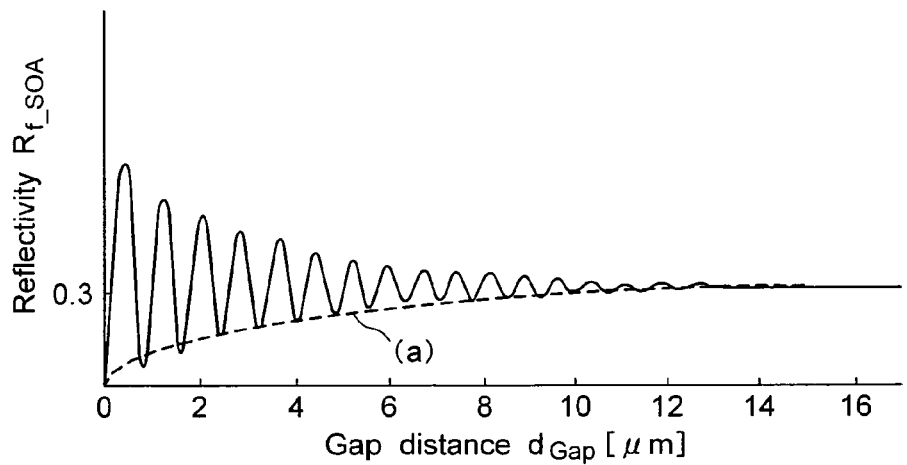
FIG. 2 is a graph showing the gap distance (dGap) dependency of the effective reflectivity RF_SOA.

FIG. 2 shows the gap distance (dGap) dependency of Rf_SOA obtained by the analysis. It is understood that the interference effect causes a ripple on the amplitude of effective reflectivity Rf_SOA in a gap distance dGap of around 15 μm or less. The ripple amplitude reduces with an increase of the dGap, assumes substantially zero at a dGap above around 15 μm, and finally converges on a specific reflectivity of around 30%. This reflectivity, around 30%, is equal to the reflectivity of the cleaved facet, and is obtained when there is no influence of the interference. The degree of interference effect can be evaluated by the relative value of the ripple amplitude where the steady-state value of the reflectivity (Rf_SOA at dGap=∞) is set at unity.

As a noteworthy point, use of the interference effect causes a change of the Rf_SOA corresponding to the dGap, although the Rf_SOA assumes around 30% (corresponding to that of the cleaved facet) if the interference effect is not used. In the example of FIG. 2, the Rf_SOA is allowed to assume a value lower than 30% and higher than several percent by taking advantage of the bottom range of the reflectivity amplitude. Therefore, the extraction efficiency of the light from the side of semiconductor optical waveguide-A 110 (SOA side) can be increased by using the interference effect. The graph (a) shown by a dotted curve in FIG. 2 connects together bottoms of the Rf_SOA amplitude, and it will be understood that the relatively shorter range of dGap is effective in taking advantage of the interference effect.

Figure 3:
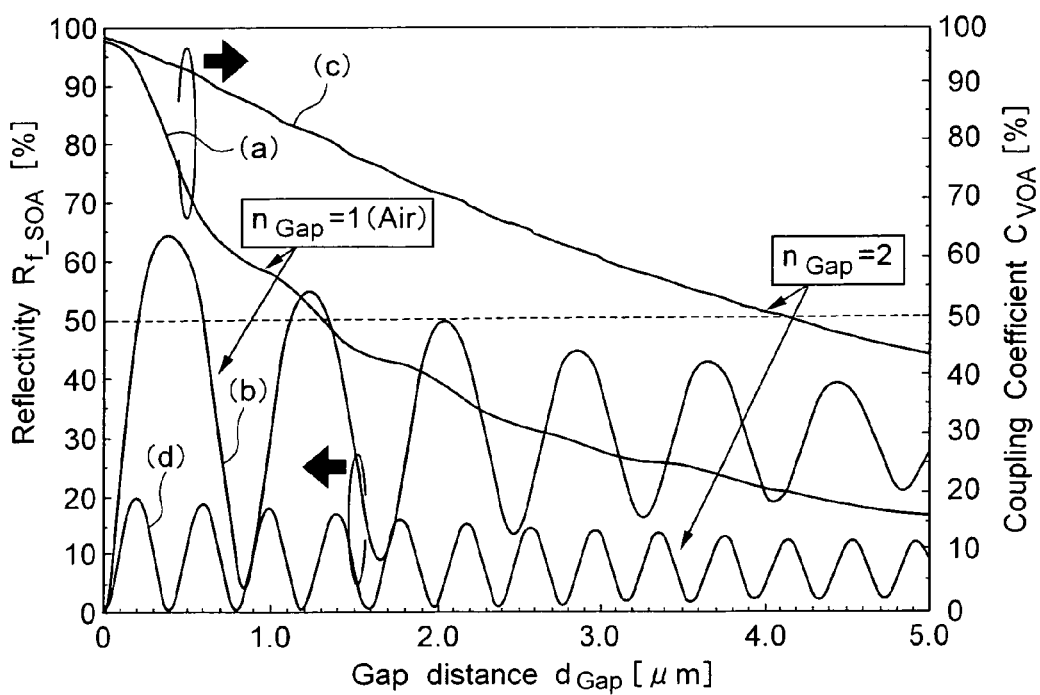
FIG. 3 is a graph showing a gap distance dependency of the effective reflectivity RF_SOA and optical coupling coefficient CVOA.

The range of dGap being 5 μm or smaller is noted here which provides a remarkable interference effect in FIG. 2. The gap distance dependency of the effective reflectivity Rf_SOA and optical coupling coefficient CVOA was investigated for the case of gap refractive index being nGap=1 and nGap=2. FIG. 3 shows the results of this investigation. In FIG. 3, graph (a) and graph (b) show the gap distance dependency of the optical coupling coefficient CVOA and effective reflectivity Rf_SOA, respectively, for the case of nGap=1, and graph (c) and graph (d) show the gap distance dependency of the optical coupling coefficient CVOA and effective reflectivity Rf_SOA, respectively, for the case of nGap=2. It will be understood with reference to FIG. 3 that the optical coupling coefficient CVOA falls with an increase of the dGap. This originates form the fact that the light is being lost by radiation. However, partly due to the effect of the multiple light coupling, a sudden disappearance to zero does not occur.

For the case of nGap=1, since the radiation angle of light is comparatively large, and the interference effect is rapidly being lost with an increase of the dGap, the reduction rate of CVOA accompanying the increase of dGap is large, as shown by graph (a). With reference to graph (a), a dGap of around 1.3 μm or less can provide CVOA>50% for the case of nGap=1. On the other hand, for the case of nGap=2, as shown in graph (c), the reduction rate of CVOA accompanying the increase of dGap is small, because the radiation angle of light is comparatively small and the reduction rate of interference effect accompanying the increase of dGap is small. With reference to graph (c), a dGap of around 4 µm or less provides CVOA>50% for the case of nGap=2.

As to the reflectivity Rf_SOA, in the case of nGap=1 and nGap=2 as shown by graph (b) and graph (d), respectively, the interference effect causes a periodic vibration depending on the dGap. Accordingly, it is sufficient that dGap be set at the value providing a desired reflectivity. However, it was found that a concrete isolation trench, if manufactured, has a deviation (range of variation) of 0.1 to 0.2 µm between the target value and the actual value, and thus the value of dGap is preferably set at a value in consideration of the error. Graph (b) and (d) show that the value of Δ Rf_SOA/Δ dGap assumes a minimum at the peak position and bottom position of the curve, and thus the peak position or bottom position is preferably used as the design position of dGap.

In the case of nGap=1 (graph (b)), for example, the dGap is set at dGap=0.85 µm at which the Rf_SOA amplitude assumes a "bottom position". In this case, assuming that Λ is the period of Rf_SOA in the vicinity of the bottom position at dGap=0.85 µm, a range of 0.85±Λ/4 µm for the dGap allows the Rf_SOA to assume a value not lower than several percent and not higher than around 30%, whereby a desired reflectivity can be obtained even if some error occurs. On the other hand, in the case of nGap=2 (graph (d)), the reflectivity is 1% or less at the bottom position of the amplitude of Rf_SOA, and accordingly, the dGap is set at a peak position of the amplitude of Rf_SOA, because the above reflectivity is excessively low. In this case, setting the dGap at the "peak position"±Λ/4 allows the Rf_SOA to assume a value not lower than ten and several percent and not higher than around 20%.

Summing up the above, as to the CVOA, the range of dGap providing a suitable value for both the Rf_SOA and CVOA at the same time can be enlarged with an increase of nGap from nGap=1 in the range of nGap not lower than 1 and not higher than around 2. In this case, as to the Rf_SOA, it is effective to use a peak position or bottom position of the Rf_SOA curve, at which the Δ Rf_SOA/Δ dGap assumes a lower value, depending on the nGap. However, a technique for controlling the reflectivity Rf_SOA in a further flexible manner is desired, upon setting the peak position or bottom position. This technique will be described later in [influence of bent angle θ h of waveguide with respect to horizontal direction].

It should be noted that the refractive index difference between the semiconductor part and the gap part will be excessively small if the nGap increases, exceeding nGap=2, up to a value (around 3) corresponding to the refractive index of the semiconductor substrate, whereby it is difficult for the use of interference effect to provide a sufficient refractive index. Therefore, the suitable value of nGap is not lower than 1 and not higher than around 2. In addition, as to a lower limit of the dGap, by obtaining a value of dGap at which the ripple of Rf_SOA first assumes a peak position or bottom position while monotonically increasing the dGap from dGap=0 µm, the value may be considered as the lower limit of dGap.

[Influence of Bent Angle θ h of Waveguide with Respect to Horizontal Direction]

Figure 4A:
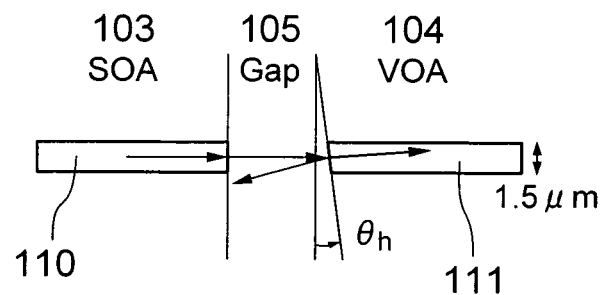
FIGS. 4A and 4B each are a schematic view showing a model in which the facet of the semiconductor optical waveguide facing the isolation trench is bent.
Figure 4B:
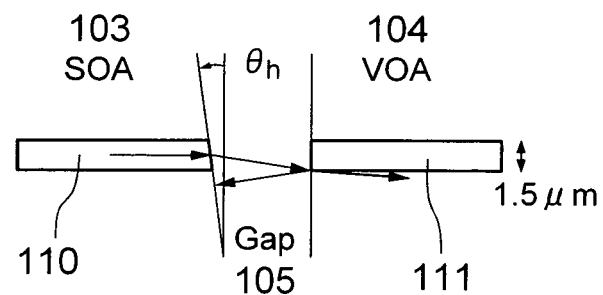

Next, it is analyzed what kind of influence the bent angle of waveguide with respect to the horizontal direction imposes. Two types of inclination shown in FIGS. 4A and 4B will be considered here as the inclination of waveguide from the horizontal direction. More specifically, the two cases are considered here including a case of inclining semiconductor optical waveguide-B 111 on the side of VOA region 104 by θ h as shown in FIG. 4A, and the other case of inclining semiconductor optical waveguide-A 110 on the side of SOA region 103 as shown in FIG. 4B. In this investigation, the gap refractive index nGap was set at around 1.43 (corresponding to that of $SiO_2$), and the gap distance dGap was set at 2.5 µm. The width of optical waveguide was maintained at 1.5 µm (spot size of light is around 2 µm). This condition is such that the bent angle θ h=0° from horizontal direction can provide a CVOA of around 50% and an Rf_SOA of around 30% which is around double the constant-state value (value obtained at dGap=∞). The arrows extending from the SOA region 103 to the VOA region 104 schematically represent the propagation of light emitted from the SOA region 103 to the VOA region 104.

Figure 5A:
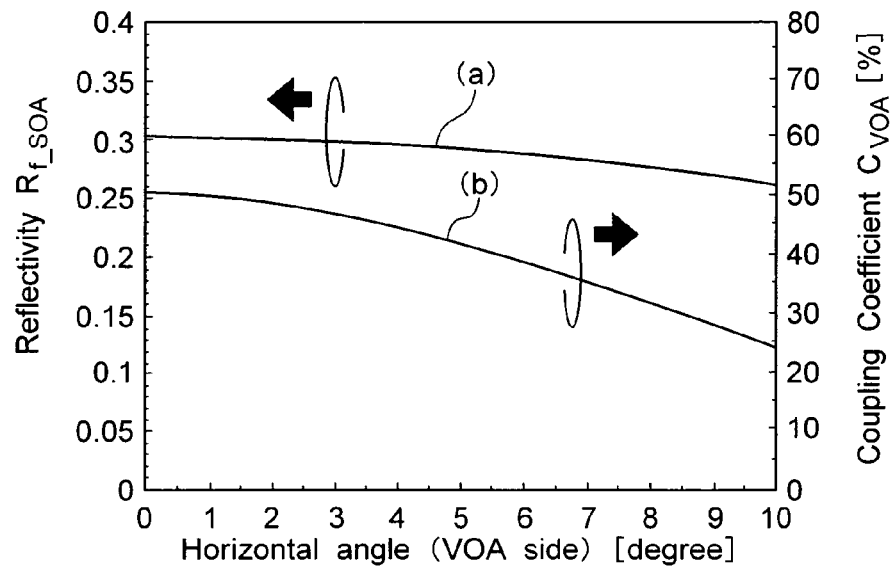
FIGS. 5A and 5B are graphs showing a θ h dependency of the RF_SOA and CVOA in the model of FIGS. 4A and 4B, respectively.
Figure 5B:
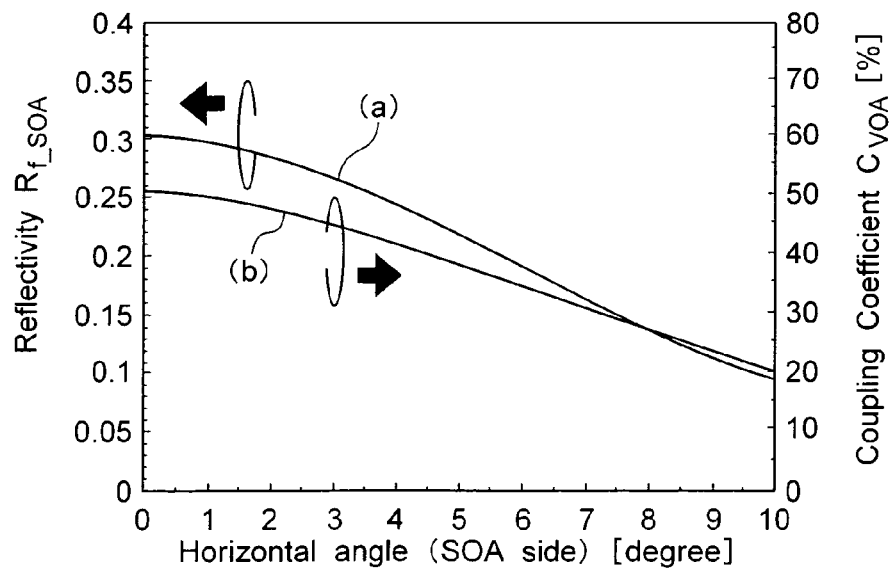

FIGS. 5A and 5B each show a θ h dependency of the Rf_SOA and CVOA. FIG. 5A shows the dependency in the structure of FIG. 4A, whereas FIG. 5B shows the dependency in the structure of FIG. 4B. If the facet on the side of VOA region 104 is bent as shown in FIG. 4A, the Rf_SOA does not significantly fall with an increase of the θ h (graph (a)), as shown in FIG. 5A, and thus it is understood that the interference effect on the reflection is maintained to some extent. As a result, the change of Rf_SOA is limited to around a range from 30% to 26% with a change of θ h in a range from 0° to 10°. However, the optical coupling coefficient CVOA falls significantly from 50% to 26% (graph (b)). This is considered due to a larger influence by the deviation of optical axis compared to the interference effect.

On the other hand, in the case of inclining the facet on the side of SOA region 103, as shown in FIG. 4B, the Rf_SOA significantly falls (graph (a)), as shows in FIG. 5B, and felled from 30% to around 10%, i.e., to ⅓, in a range from 0° to 10° of the bent angle. The falling rate of the optical coupling coefficient CVOA in this case was from 50% to around 20%, (graph (b)) which is substantially same as in the case where the facet on the side of VOA region 104 is bent. The reason why the Rf_SOA falls in the case of FIG. 4B is considered due to the effect of inclination of the optical waveguide as described in JP-1995-20359A. However, the result shown in FIG. 5B may be evaluated as a suppression of the reduction rate from that described in JP-1995-20359A. This will be described hereinafter. In consideration that the spot size of light is around 2 µm and the refractive index nGap of the gap (trench) is around 1.43, i.e., larger than 1, in the condition of FIG. 5B, this condition is considered equivalent to that of FIG. 2 in JP-1995-20359A where the spot size is W=3 µm. However, the amount of attenuation in the reflection, i.e., reflectivity reduction rate of Rf_SOA estimated in FIG. 5B is considerably smaller than that in JP-1995-20359A (equal to around 20 dB, which corresponds to a reduction of Rf_SOA from 30% to 0.3%), and this is considered the influence by the interference effect found by the present invention. From this fact, the contents described in JP-1995-20359A were considered to correspond the case where there is no interference effect or the case where the interference effect itself is not envisaged, and thus the configuration described in JP-1995-20359A is considered effective to the region without the interference effect.

Figure 6A:
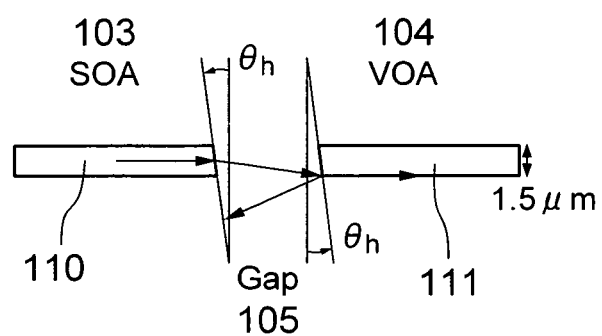
FIGS. 6A and 6B each are a schematic view showing a model in which both the facets of the semiconductor waveguides facing the isolation trench are bent.
Figure 6B:
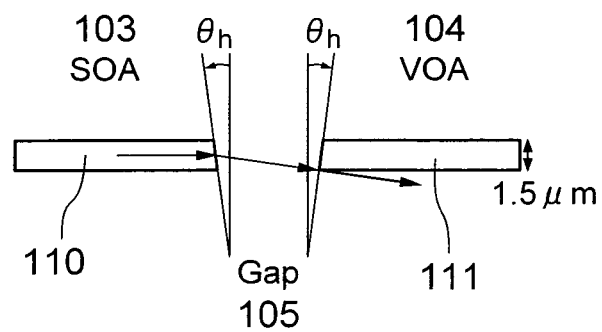

As described above, in the structure of FIGS. 4A and 4B, it is possible to reduce the Rf_SOA in the control using a change of the θ h in any case; however, there arises a significant reduction rate in the CVOA with an increase of the θ h, and thus it is desired to find the structure for suppressing the reduction of the CVOA. One of the causes considered for the degradation of the CVOA is a deviation of the optical axis of the light that enters from semiconductor optical waveguide-A 110 on the side of SOA region 103 to semiconductor optical waveguide-B 111 on the side of VOA region 104. Thus, noting a compensation of the deviation of optical axis, we considered to incline the facet on the side of SOA region 103, and at the same time, incline also the facet on the side of VOA region 104. FIG. 6 shows the model for this investigation. Considering an alignment of the optic axis between SOA and VOA, it is effective to introduce the θ h to provide a point symmetry so that the facet on the side of SOA and the facet on the side of VOA are parallel to each other, as shown in FIG. 6A. On the contrary, if the θ h is introduced to provide a point symmetry such as shown in FIG. 6B, the deviation of optical axis will be increased.

Figure 7A:
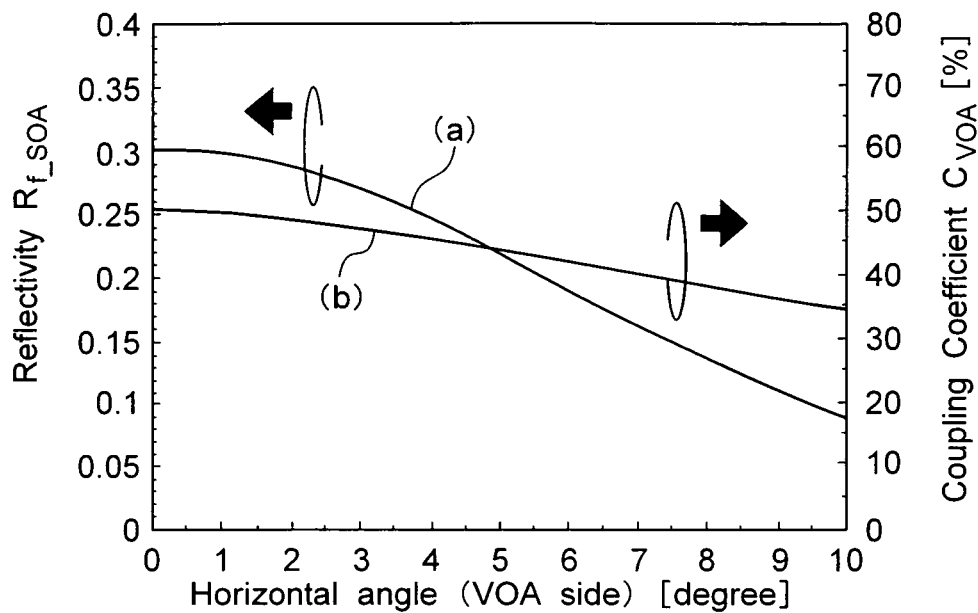
FIGS. 7A and 7B each are a graph showing a θ h dependency of the Rf_SOA and CVOA in the model of FIGS. 6A and 6B, respectively.
Figure 7B:
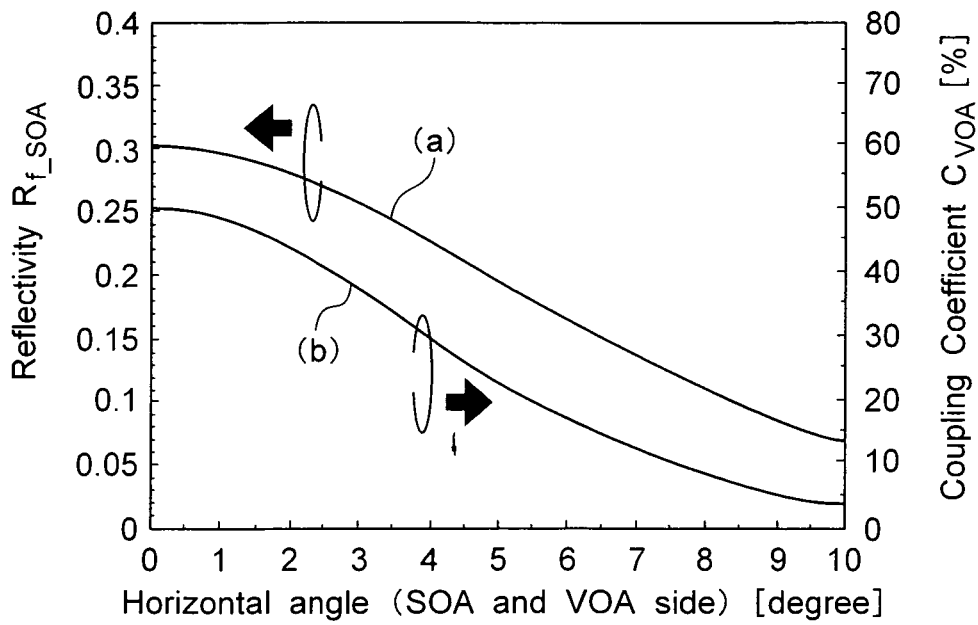

FIGS. 7A and 7B each illustrate a θ h dependency of the Rf_SOA and CVOA. FIG. 7A shows the results in the structure of FIG. 6A, whereas FIG. 7B shows the results in the structure of FIG. 6B. The Rf_SOA falls from 30% to 9% with an increase of the bent angle, as shown by graph (a) in FIG. 7A, if the facet on the side of SOA region 103 and the facet on the side of VOA region 104 are bent to provide a point symmetry as shown in FIG. 6A. It should be noted that the value itself is equivalent to that shown in FIG. 5B for the case where only the facet on the side of SOA region 103 is bent. However, noting the CVOA, although a sharp reduction from 50% down to 25% appeared in the case where only the facet on the side of SOA region 103 is bent, as shown in FIG. 5B, the reduction of the CVOA is suppressed down to a range from 50% to around 35% as shown by graph (b) in FIG. 7A, whereby it may be concluded that the result of alignment of the optical axis appeared remarkably. On the other hand, if the facet on the side of SOA region 103 and facet on the side of VOA region 104 are bent to provide a line symmetry, as shown in FIG. 7B, although the reduction of Rf_SOA (graph (a)) is substantially equivalent to that in the case of the point-symmetry inclination (FIG. 7A), the CVOA is markedly degraded (graph (b)), and reduced from 50% to 3.5%. This is considered due to an increased misalignment of the optical axis.

Based on the above investigation, we obtained a prospect that introduction of a bent structure in both the facet on the side of SOA region 103 and facet on the side of VOA region 104 for obtaining a point symmetry will provide a control of the Rf_SOA at a "suitable value" for the improvement of extraction efficiency of light as well as a relatively larger CVOA. We believe this technique is effective for controlling the Rf_SOA to a lower value, if it is necessary to set the dGap at a peak position of the Rf_SOA curve, such as in the case of nGap=2 in FIG. 3. In addition, it is effective in the approach of setting the dGap at a peak position of the Rf_SOA curve and achieving a suitable value for the reflectivity Rf_SOA even in the case of nGap=1.

Figure 8:
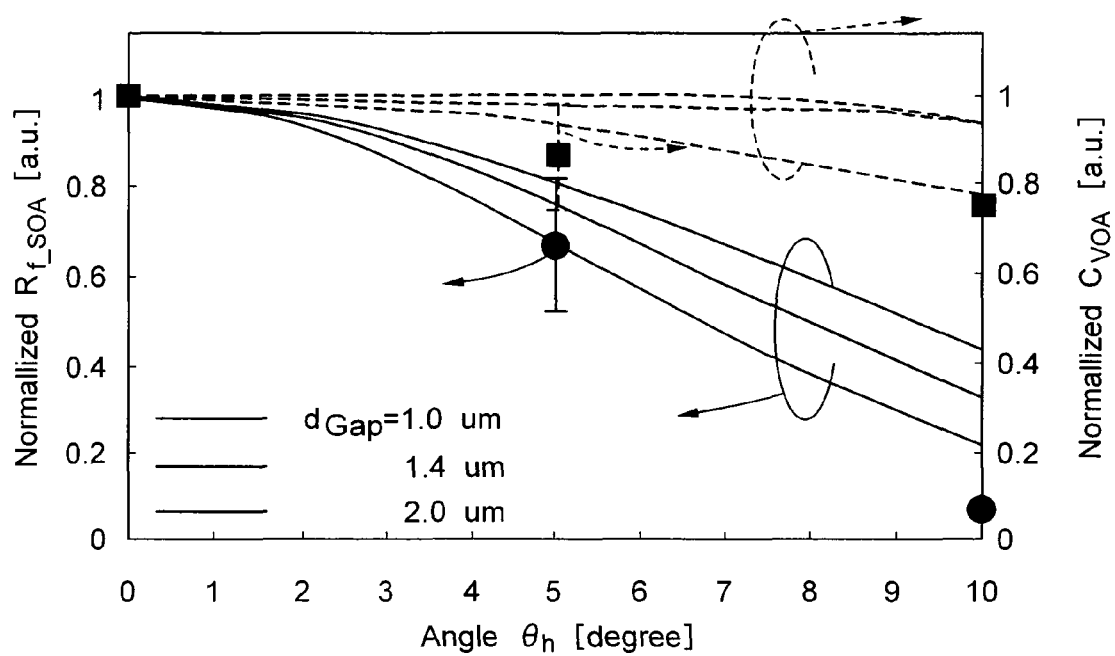
FIG. 8 is a graph showing the relationship between the θ h and the Rf_SOA and CVOA in the case of nGap=1.

FIG. 8 shows the relationship between the θ h and the Rf_SOA and CVOA in the case of nGap=1. In FIG. 8, the value of Rf_SOA and CVOA is normalized by the value thereof for θ h=0°. The relationship between the θ h and the Rf_SOA and CVOA was found by simulation for different three types of dGap, to reveal that the Rf_SOA monotonically decreases with an increase of the θ h for any dGap, as shown in FIG. 8. On the other hand, the CVOA hardly depends on the θ h. In particular, test results of the Rf_SOA and CVOA plotted in FIG. 8 for the case of dGap=2 revealed that the test result and the calculated result well match with each other. Thus, it is found that use of a suitable θ h maintains the CVOA at a higher value and provides an arbitrary Rf_SOA.

However, even if the facet on the side of SOA region 103 and facet on the side of VOA region 104 are bent to provide a point symmetry, as shown by graph (b) in FIG. 7B, the value of CVOA was not recovered up to 50%, which is the value before the inclination. Thus, a further improvement is desired. In view of this, correction for an inter-SOA/VOA deviation of the horizontal position of light is considered, in addition to the deviation of the optical axis, to thereby introduce an offset of the horizontal position into the optical waveguide on the side of VOA region 104.

[Influence of Horizontal Position Offset (doffset) in SOA-VOA Waveguides]

In the following investigation, as the parameters fixed beforehand, gap refractive index nGap≈1.43, optical waveguide width of 1.5 μm (optical spot size of around 2 μm), and gap distance dGap=2.5 μm are used, with the bent angle being θ h=7°. The optimum offset of horizontal position of semiconductor optical waveguide-B 111 on the side of VOA region 104 depends on those four parameters, and should be first grasped in the investigation. Use of combination of these parameters provides the CVOA at 50% or above of that in the case of θ h=0°, the Rf_SOA at around ½ of that in the case of θ h=0°.

Figure 9:
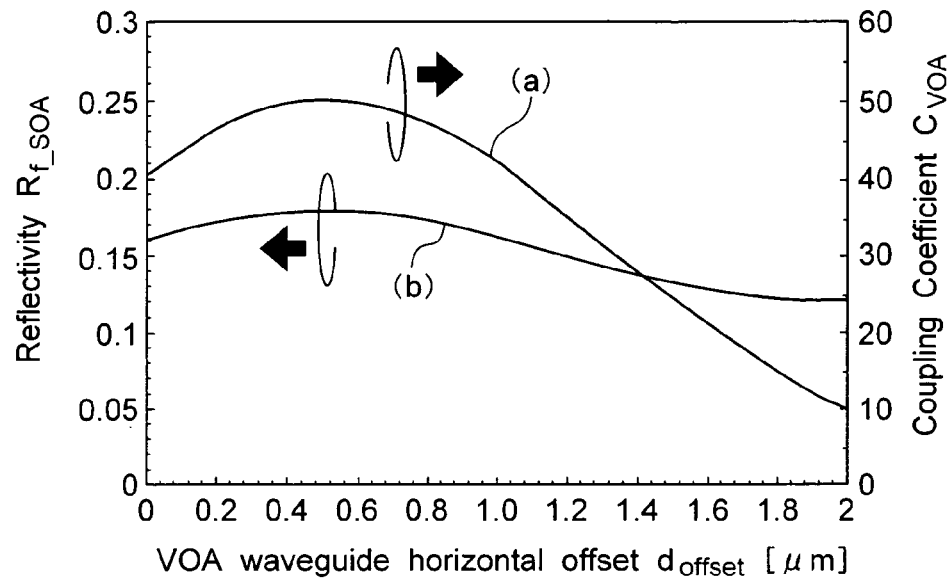
FIG. 9 is a graph showing an offset dependency of the effective reflectivity Rf_SOA and optical coupling coefficient CVOA.

FIG. 9 shows results of the analysis. Although the CVOA assumes around 40%, which is 10% less than the initial value of 50%, for the horizontal position offset doffset=0 (graph (a)), it improves with an increase of the offset, and assumes a maximum (around 50%) for doffset=0.5 μm. This value is substantially equal to the initial value for θ h=0°, and it is found that degradation of CVOA due to introduction of θ h can be compensated substantially completely. Since introduction of the offset changes the effective gap distance, the Rf_SOA value slightly changes with a change of the offset (graph (b)). Here, when the gap refractive index nGap is 1 or above, the refractive angle of light irradiated to the gap decreases. Therefore, a larger nGap suffices a smaller offset doffset.

[Influence of Input/Output Optical Waveguide Width (Spot Size of Light)]

Figure 10:
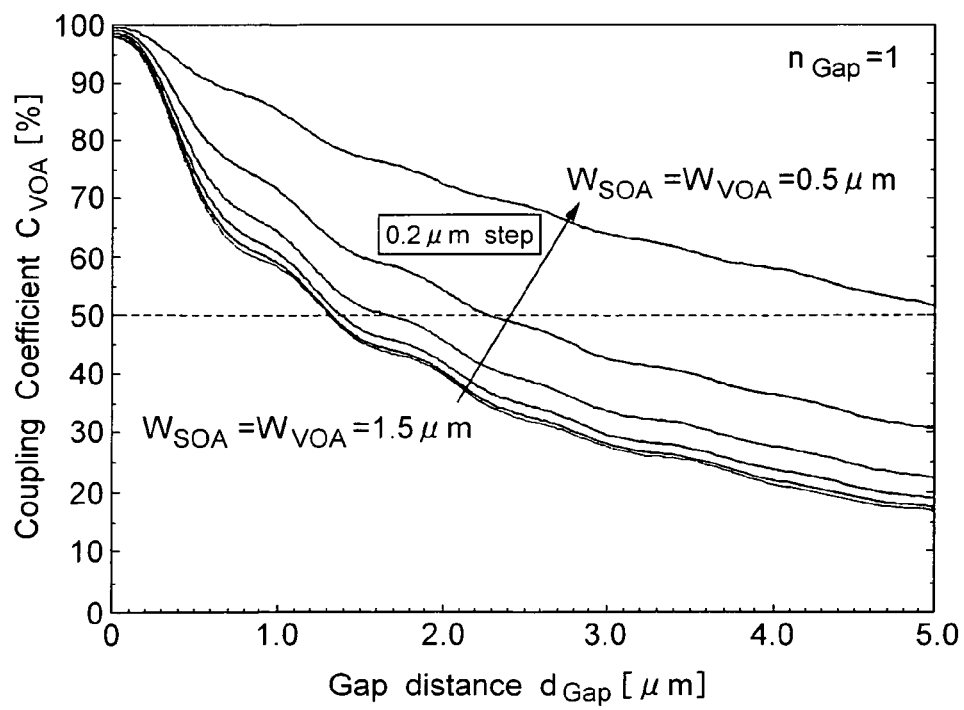
FIG. 10 is a graph showing a gap distance dependency of the optical coupling coefficient CVOA upon changing the width of semiconductor optical waveguide.
Figure 11:
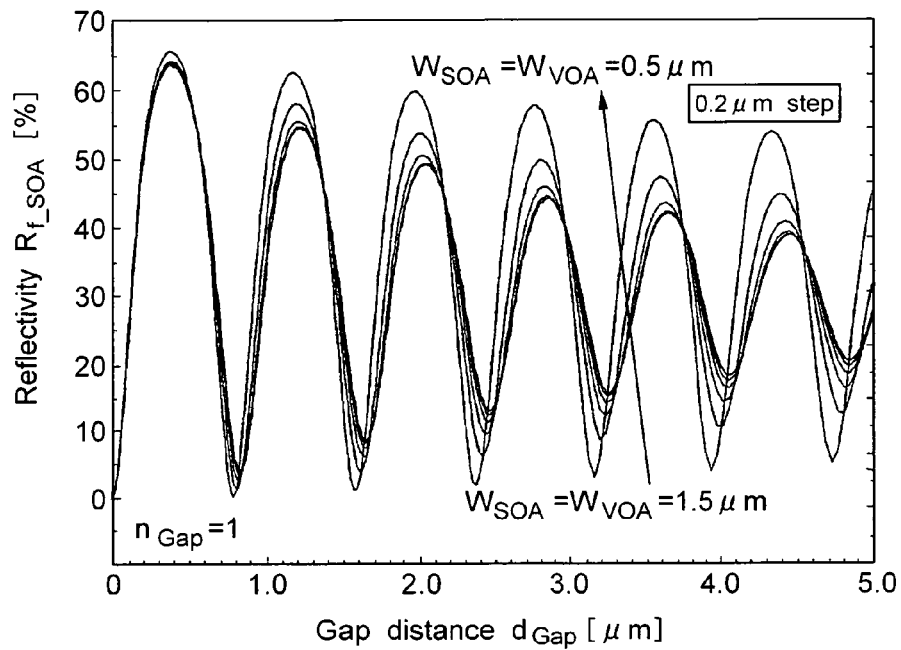
FIG. 11 is a graph showing a gap distance dependency of the effective reflectivity Rf_SOA upon changing the width of semiconductor optical waveguide.

Now, investigation is directed to the influence of enlargement of the optical spot size on the optical coupling coefficient CVOA and effective reflectivity Rf_SOA due to a narrower width (WSOA, WVOA) of the optical waveguide for inputting/outputting light to/from the gap. In this investigation, width of the semiconductor optical waveguide is reduced from 1.5 μm to 0.5 μm with a step of 0.2 μm, and the optical coupling coefficient CVOA and effective reflectivity Rf_SOA were obtained for each optical waveguide width. FIGS. 10 and 11 show the results. With reference to FIG. 10, it will be understood that employment of a narrower width for the width WSOA of semiconductor optical waveguide-A 110 and width WVOA of semiconductor optical waveguide-B 111 significantly suppresses the reduction rate of the CVOA with respect to the dGap. In particular, by reducing the width WSOA and WVOA from 1.5 μm to 0.5 μm (which corresponds to enlargement of the optical spot size from around 2 μm to 8 μm), it is expected that CVOA is larger than 50% until the gap distance increases up to 5 μm. On the other hand, as shown in FIG. 11, a narrower width of WSOA and WVOA does not significantly reduce the ripple amplitude of Rf_SOA with an increase of the dGap, and the initial amplitude is maintained. This is because the light travels for a larger distance without diffusion due to a resultant smaller radiation angle of light. In short, it is considered due to an increase of the interference-enabling distance.

Figure 12:
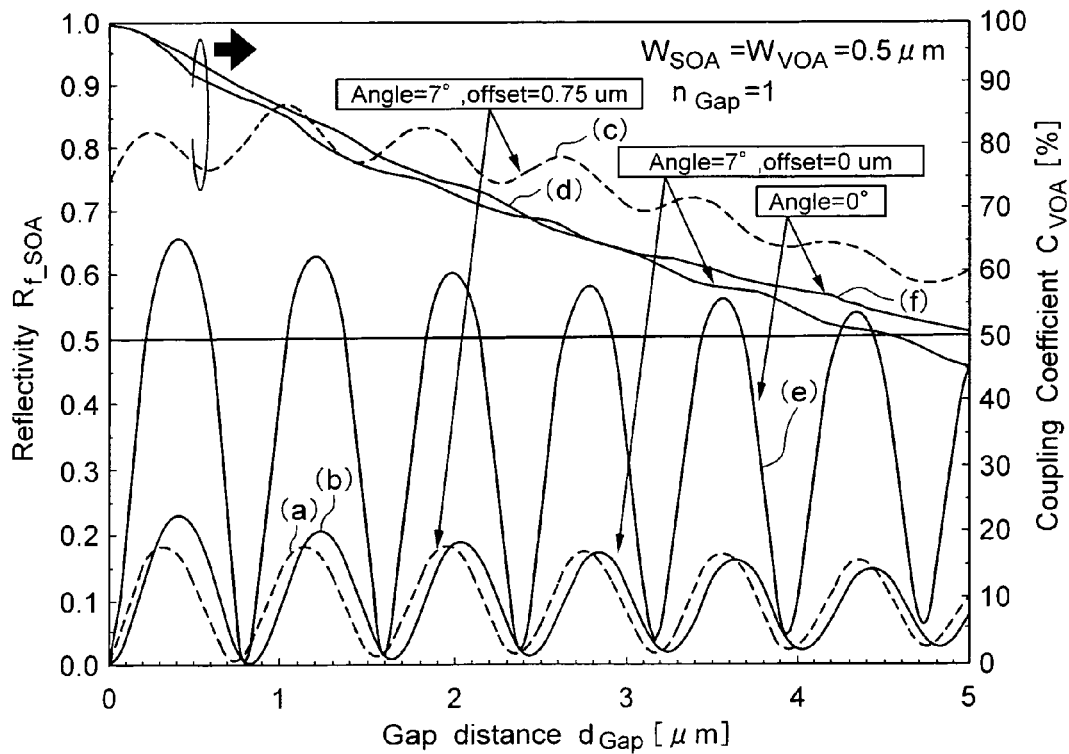
FIG. 12 is a graph showing a gap distance dependency of the effective reflectivity Rf_SOA and optical coupling coefficient CVOA.

Finally, enlargement of the optical spot size and simultaneous introduction of horizontal bent angle θ h of the facets will be considered. Investigation is directed to both the cases of presence and absence of the offset in the case of point symmetry arrangement, such as shown in FIG. 6A, and θ h=7°. In the case of presence of the offset, an offset amount of doffset=0.75 µm was employed at which the CVOA assumes a maximum in FIG. 9. FIG. 12. shows results of the investigation. In FIG. 12, the Rf_SOA and CVOA in the case of θ h=0° and doffset=0 are shown by graph (e) and graph (f), respectively, for the purpose of comparison. As shown by graph (b) in FIG. 12, employment of θ h=7° allowed the Rf_SOA amplitude to be adjusted at a suitable value of around 0.2 (effective reflectivity of 20%), i.e., a suitable value to be applied to the device. At the same time, it was assured that a CVOA of 50% is obtained for a range of dGap around 4 µm or less (graph (d)). Further, it was assured that introduction of the offset achieves a structure having a wide tolerance for the CVOA, dGap and Rf_SOA (graph (a), (c)), and in particular, a CVOA exceeding 70% and the optimum Rf_SOA≈0.2 can be obtained for the case of dGap≈2 µm.

Hereinafter, a variety of aspects of the present invention will be described. In the semiconductor laser of the present invention, a configuration may be employed wherein the isolation trench is filled with a medium having a refractive index nGap, which is lower than the refractive index of the semiconductor substrate and resides in a range of 1 to 2. In this case, the range of dGap providing the characteristic suitable as a semiconductor laser is expanded in the direction of a longer dGap. In addition, by measuring the length of dGap actually formed after forming the isolation trench and filling the trench part with a medium having a refractive index nGap, which provides desired Rf_SOA and CVOA depending on the length, the product errors during the processing for forming the dGap can be compensated, whereby higher output-power and higher efficient semiconductor laser can be provided at a higher product yield.

A configuration may be employed wherein a pair of facets configuring a composite optical reflector/connector are bent in the same direction, within a plane parallel to the main surface of the semiconductor substrate, by a bent angle θ h from a direction perpendicular to the traveling direction of the light, and the bent angle θ h is smaller than the total internal reflection angle of the light at the respective facets. In this case, the range of length (dGap) of the isolation trench providing the characteristic suitable as a semiconductor laser is expanded, and the product yield of the device having superior Rf_SOA and CVOA can be improved, whereby a higher output-power and higher efficient semiconductor laser can be provided at a lower cost. By selecting a value for the θ h depending on the refractive index nGap of the trench part, a further optimized combination of the Rf_SOA and CVOA can be realized, thereby providing a higher output-power and higher efficient semiconductor laser. Since the entire light is scarcely returned to the optical waveguide if the θ h is above the total internal reflection angle, a smaller absolute value of θ h is preferable.

A configuration may be employed wherein the first and second semiconductor optical waveguides each include adjacent to the isolation trench a waveguide region having a function for converting the optical spot size. In this case, the range of dGap providing the characteristic suitable as a semiconductor laser can be expanded in a direction of longer dGap. A shorter dGap of the target requires a high definition patterning in the process for forming the isolation trench, and necessitates an electron-beam exposure process etc. Thus, a larger dGap enables use of a stepper etc. having a higher throughput, whereby a higher output-power and higher efficient semiconductor laser can be provided at a lower cost and a higher product yield due to the use of simple equipment during fabrication of the device.

A configuration may be employed wherein the location of first and second semiconductor optical waveguides has an offset therebetween in a direction parallel to the main surface of the semiconductor substrate, with an intervention of the isolation trench. In this case, a semiconductor laser having a higher CVOA can be provided by adjusting the offset depending on the isolation distance dGap, bent angle θ, optical spot size, refractive index nGap of the isolation trench etc.

A configuration may be employed wherein the bent angle θ is 15° or less, the distance dGap of the isolation trench is 15 µm or less, the optical spot size is 10 µm or less, and the refractive index nGap is 1 to 2. In this case, further more suitable Rf_SOA and CVOA can be obtained, thereby providing a higher output-power and higher efficient semiconductor laser.

Assuming that Λ is the period of effective reflectivity on one of the facets of the first semiconductor optical waveguide with respect to the distance dGap of isolation trench and L is the length at which the effective reflectivity assumes a peak or bottom, the distance dGap of isolation trench resides in a range of L±Λ/4. Investigation of the characteristic of Rf_SOA with respect to the isolation distance dGap of isolation trench reveals that the Rf_SOA periodically changes in the range of shorter dGap. In this case, the change rate (differential) of Rf_SOA with respect to the change of dGap assumes a minimum at the position at which the Rf_SOA assumes a top or bottom. Accordingly, the dGap is set at the vicinity of top or bottom position at which a desired Rf_SOA is obtained, to minimize the Rf_SOA error after fabrication, thereby improving the product yield and providing a higher output-power and higher efficient semiconductor laser at a lower cost.

A configuration may be employed wherein the second semiconductor optical waveguide includes a light-emitting-side facet having an antireflection film formed thereon, at the side counter to a facet opposing the first semiconductor optical waveguide, and is bent at the light-emitting-side facet by an angle of 5° to 15° with respect to the light-emitting-side facet. In this case, the reflected return light from the facet of the semiconductor optical waveguide on which the antireflection film is formed can be suppressed, thereby providing a semiconductor laser having a stable lasing characteristic.

A configuration may be employed wherein the isolation trench is formed by an etching, and a pair of facets configuring the optical reflector are formed by the etching. In this case, non-wavelength-dependency can be easily achieved as the characteristic of composite optical reflector/connector, whereby variation of the optical reflection/connection characteristic due to the change of emission wavelength of the semiconductor laser can be suppressed. In addition, a process for assembling together the first optical waveguide and second optical waveguide can be omitted, thereby providing a smaller-size, higher output-power, higher efficient semiconductor laser at a lower cost and a higher product yield.

A configuration may be employed wherein a wavelength filter is provided between the first optical waveguide and the optical reflector configured as an optical resonator due to combination thereof with the above composite optical reflector/connector and first semiconductor optical waveguide.

A configuration may be employed wherein the optical reflector and wavelength filter are formed on the semiconductor substrate. In this case, a semiconductor laser is provided having a smaller and compact size and a higher mode stability.

A configuration may be employed wherein the above optical reflector and wavelength filter are optical parts provided outside the semiconductor substrate. In this case, a higher output-power and higher efficient external-resonator-type semiconductor laser can be provided by employing a laser resonator as an external-resonator type.

A configuration may be employed wherein the first semiconductor optical waveguide includes a facet having thereon an antireflection film, on the side counter to another facet opposing the second semiconductor optical waveguide. In this case, a shift to a composite resonator due to the reflection from the facet of the first semiconductor optical waveguide counter to the facet on the side of the isolation trench can be avoided, thereby providing a semiconductor laser having superior mode stability, relative intensity of noise (RIN) and line-width characteristics, as well as higher accuracy for the emission wavelength.

A configuration may be employed wherein the first semiconductor optical waveguide is bent by a range of 5° to 15° near a facet on the side counter to another facet opposing the second semiconductor optical waveguide. In this case, reflection from the facet of the first semiconductor optical waveguide on the side counter to the facet near the isolation trench can be further suppressed.

A configuration may be employed wherein the above wavelength filter includes at least one of quartz-based PLC filter, Si waveguide filter, liquid crystal filter, and optical fiber grating filter. In this case, a higher output-power and higher efficiency semiconductor laser having a wavelength set at a higher accuracy and stability can be provided.

A configuration may be employed wherein the above wavelength filter is a wavelength-tunable filter. In this case, a wavelength-tunable semiconductor laser can be provided.

A configuration may be employed wherein the first semiconductor optical waveguide has at least an optical amplification function, and the second semiconductor optical waveguide has at least a light control function.

A configuration may be employed wherein the light control function of the second semiconductor optical waveguide includes at least one of optical amplification function, optical modulation function, optical attenuation function, photodetection function, optical switch function, and optical coupling/splitting function. In this case, a semiconductor laser having a higher optical output-power characteristic due to the optical amplification function, a high-speed optical modulation characteristic due to the optical modulation function, a variable-optical-level characteristic due to the optical attenuation function, an optical monitor function, an optical routing function, and an optical coupling/splitting function can be provided. For example, the second semiconductor optical waveguide may be configured by a Mach-Zehnder optical modulator.

A configuration may be employed wherein the second semiconductor optical waveguide has an optical modulation function and an optical variable-attenuation function using a current drive. In this case, even if the coupling coefficient CVOA of light to the second semiconductor optical waveguide is actually below 50% due to some malfunction in the fabrication etc., the second semiconductor optical waveguide is allowed to have the optical amplification function, whereby an optical modulation characteristic as well as optical attenuation characteristic can be obtained at a sufficient optical output power, thereby providing a semiconductor laser capable of non-wavelength-dependency modulation which is highly effective in the case of wavelength-tunable lasing.

A configuration may be employed wherein the first semiconductor optical waveguide further includes an optical phase adjustment function. In this case, a wavelength-tunable semiconductor laser can be provided wherein the mode is further stabilized by a phase tuning function and combination with a wavelength-tunable filter in particular.

Figure 13A:
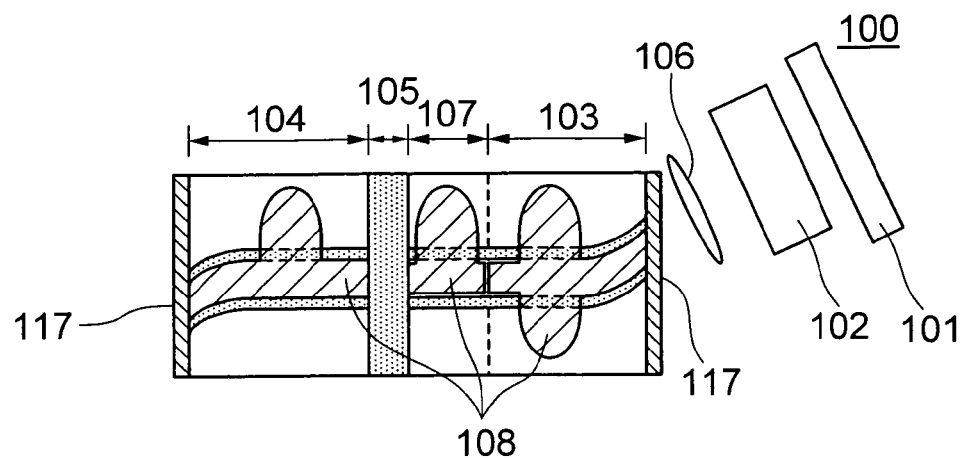
FIG. 13A is a schematic top plan view of an external-resonator-type wavelength-tunable laser according to a first exemplary embodiment of the present invention.
Figure 13B:
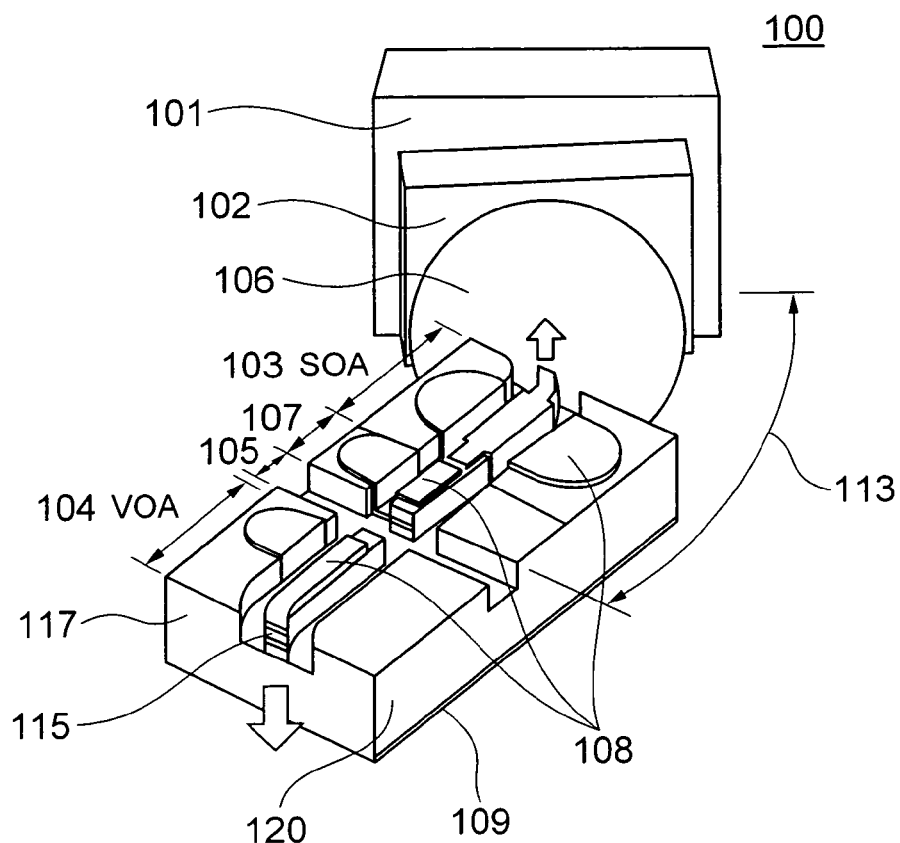
FIG. 13B is a perspective view thereof.

Hereinafter, preferred embodiments of the present invention will be described in detail with reference to the accompanying drawings. FIG. 13A schematically shows the top surface of an external-resonator-type Wavelength-tunable semiconductor laser according to a first exemplary embodiment of the present invention, and FIG. 13B shows a perspective view thereof. The external-resonator-type wavelength-tunable semiconductor laser 100 includes a semiconductor optical amplifier (SOA) 103, a phase adjustment region 107, an isolation trench 105 and a variable optical attenuator (VOA) 104, which are monolithically integrated on an InP substrate 120, and a collimating lens 106, a wavelength filter 102 and an optical reflector 101, which are disposed outside. The SOA region 103, phase adjustment region 107, collimating lens 106, wavelength filter 102 and optical reflector 101 configure a laser resonator 113. Numerals 108 and 109 represent a p-electrode and an n-electrode, respectively.

The region length of semiconductor optical amplifier (SOA) 103 on the n-InP substrate 120 is 600 μm, the region length of phase adjustment region 107 is 150 μm, and the region length of optical attenuator (VOA) 104 is 500 μm. The SOA region 103 includes, consecutively from the bottom layer on the substrate, a 100-nm-thick InGaAsP lower optical confinement layer, a six-layer-multiple-quantum-well active layer having a photoluminescence wavelength of around 1.56 μm and including compressive-strained InGaAsP well (5 nm thick)/InGaAsP barrier (10 nm thick), a 100-nm-thick InGaAsP upper optical confinement layer, a 2-μm-thick p-InP cladding layer, and a 0.3-μm-thick $p^+$-InGaAs contact layer. A region of the SOA region 103 facing the collimating lens 106 is configured as an angled waveguide (bent waveguide), and is bent by 5° with respect to a cleaved facet. An AR film 117 is formed on this facet, and the synergistic effect between the angled-facet waveguide and the AR film 117 suppresses the facet reflectivity down to 0.1% or less. The phase adjustment region 107 includes an optical waveguide comprised of an InGaAsP bulk layer having a thickness of 250 nm and a composition wavelength of 1.3 μm. The SOA region 103 and the phase adjustment region 107 are coupled together by a butt joint.

The isolation trench 105 is formed by dry etching in the optical waveguide region configured by a bulk layer, and has a depth of around 8 μm. In order to precisely configure the trench part upon forming the isolation trench 105, it is necessary to select a mask having a higher etching tolerance and a thickness as thin as possible. The isolation trench 105 is formed by an ICP dry etching in the final step of the process, during which a metal such as Ti, $SiO_2$, or SiON may be used as a mask. As a high-precision mask, a metallic mask having a relatively higher selectivity ratio is preferable, and in the present embodiment, a 75-nm-thick Ti mask was used. The resultant etched surface was highly smooth, and a verticality of around 89.50 was obtained. As to the inclination with respect to the horizontal direction, a point-symmetric inclination such as shown in FIG. 6A was employed, wherein the bent angle was 10° with respect to the phase adjustment region 107 and VOA region 104. The isolation trench 105 was filled with air, and the gap refractive index was nGap=1. The trench distance dGap was 0.8 μm. The above configuration achieved around 4% for the effective reflectivity toward the laser resonator, and 55% for the optical coupling coefficient of light emitted from the phase adjustment region 107 to the VOA region 104.

The VOA region 104 has a structure similar to that of the SOA region 103. The emitting facet side of VOA region 104 is configured as an angled waveguide, which is 5°bent with respect to the cleaved surface. An AR film 117 is formed on this facet, and the synergistic effect between the angled-facet waveguide and the AR film 117 suppresses the facet reflectivity down to 0.1% or less. This bent angle is the same as the bent angle (=50) of the angled waveguide of the area facing the collimating lens 106 of the SOA region 103. Use of the same angle allows the optical axis extending toward the optical fiber for light extraction and the optical axis extending toward the collimating lens 106 to match with each other during arrangement of the laser in a module. Thus, the components configuring this wavelength-tunable laser, i.e., InP substrate 120, and collimating lens 106, wavelength filter 102, optical reflector 101, etc. which are disposed outside can be arranged in a minimum area. It is to be noted here that as to the bent angle of the device emission facet, an excessively smaller angle reduces the effect of the reflectivity reduction, and conversely, an excessively larger angle deforms the shape of emitted beam to thereby degrade the coefficient of the optical coupling to the fiber etc. Therefore, the bent angle should be limited to a suitable range, and we consider that a bent angle as small as possible within a range of around 5° to 15° is preferable.

In the SOA region 103, phase adjustment region 107 and VOA region 104, a pad configured by Ti/Pt/Au electrode is formed as a p-electrode 108, whereas a Cr/Au electrode is formed as an n-electrode 109. In each region, a pnp current block 115 is formed as a current block layer.

The optical reflector 101, wavelength filter 102 and collimating lens 106 are disposed outside the n-InP substrate 120. A collimating lens having a diameter of 2.5 mm was used as the collimating lens 106. A filter configured by a liquid crystal was used as the wavelength filter 102. The transmission peak wavelength of this wavelength filter 102 can be tuned by changing the voltage applied to the filter, and is adjustable within a range between 1.53 µm and 1.57 µm. A reflection mirror coated with a Au film was used as the optical reflector 101.

An optical module was eventually manufactured which included the external-resonator-type semiconductor laser 100 having the configuration as described above, and a wavelength locker unit compatible to the 50 GHz interval, defined in the ITU standard, and using "two photodiodes and etalon". A phase control was performed by using 120 mA for an injected current to the SOA region 103, and around 5 mA or less for a tuning current to the phase adjustment region 107, and the VOA region 104 was used for optical amplification using an injected current of 200 mA. Under the above conditions, the module characteristics were measured to reveal a tunable-wavelength range as wide as 40 nm and a wavelength tuning at a 50 GHz interval, and achieved on this occasion a superior module optical output power of 20 mW and side-mode-suppression ratio of 50 dB. In addition, as a VOA function for preventing leakage of undesirable light to the other channel during the wavelength tuning, an optical extinction ratio of −55 dBm was obtained at 0 mA for the injected current to the VOA region.

Figure 14:
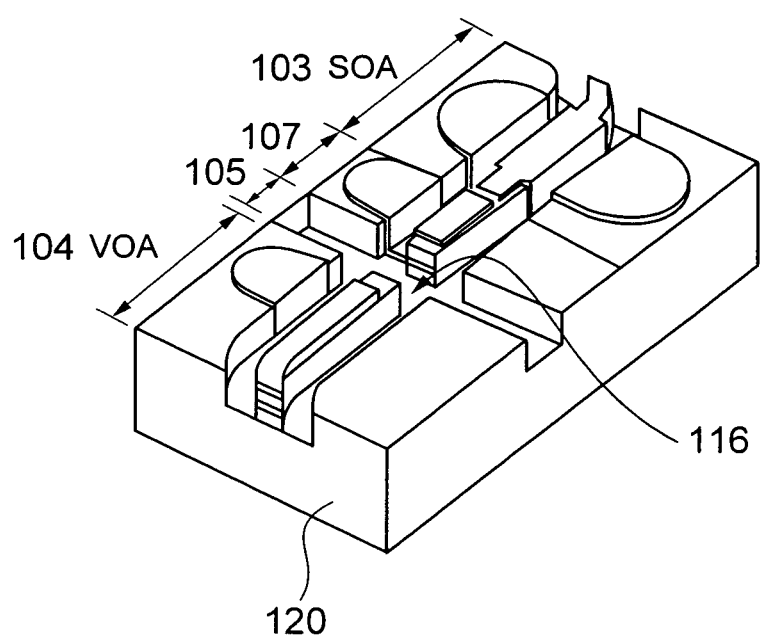
FIG. 14 is a perspective view showing an example of modification of the external-resonator-type wavelength-tunable laser of the first exemplary embodiment.

In order to obtain a highly reliable device, it is effective to form a passivation film such as made of $SiO_2$ on the isolation trench 105, or to seal the trench part with passivation gel 116 such as glycerin or BCB (benz-cyclo-butene), as shown in FIG. 14. However, since the refractive index nGap of the trench part increases up to around 1.5 in this case, it is necessary to appropriately set the combination of trench distance dGap and bent angle θ h depending on the nGap.

Figure 15A:
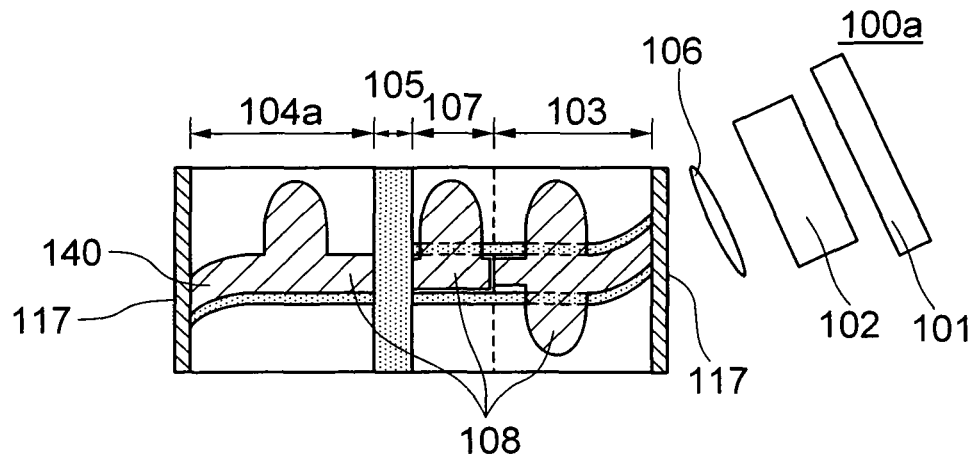
FIG. 15A is a schematic top plan view of an external-resonator-type wavelength-tunable laser according to a second exemplary embodiment of the present invention.
Figure 15B:
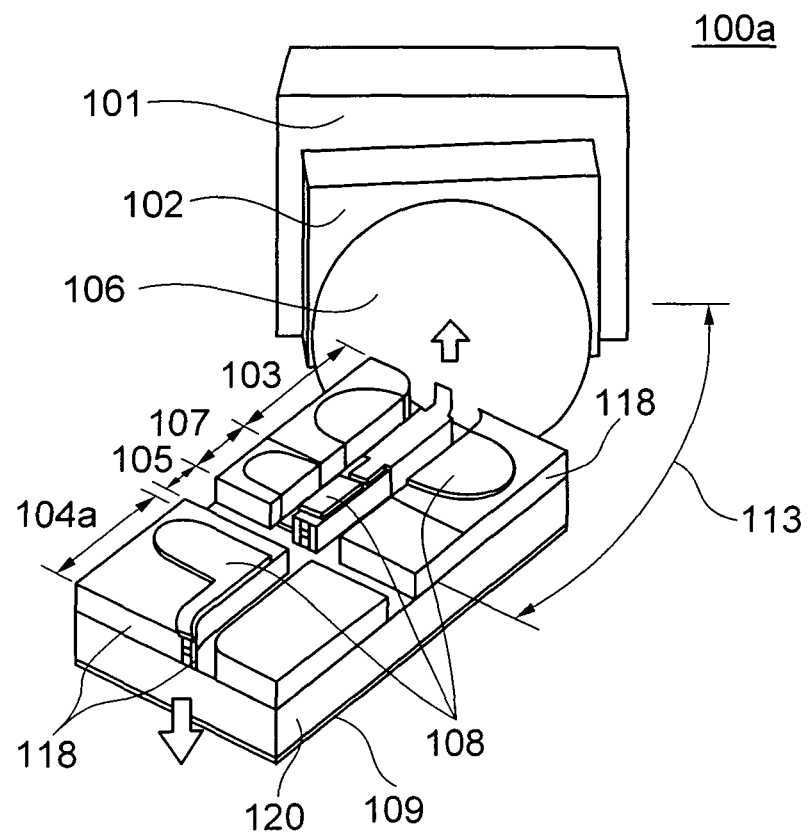
FIG. 15B is a perspective view thereof.

FIG. 15A schematically shows the top surface of an external-resonator-type wavelength-tunable semiconductor laser according to a second exemplary embodiment of the present invention, and FIG. 15B shows a perspective view thereof. This external-resonator-type wavelength-tunable semiconductor laser 100a includes a SOA region 103, a phase adjustment region 107, an isolation trench 105 and an optical modulator/VOA region 104a capable of optical modulation using a current drive, which are monolithically integrated on an InP substrate 120, and a collimating lens 106, a wavelength filter 102 and an optical reflector 101, which are disposed outside.

The region length of SOA region 103 on the n-InP substrate 120 is 550 µm, the region length of phase adjustment region 107 is 100 µm, and the region length of optical modulator/VOA region 104a is 250 µm. The SOA region 103 includes, consecutively from the bottom layer on the substrate, a 130-nm-thick InGaAsP lower optical confinement layer, a six-layer-multiple-quantum-well active layer having a photoluminescence wavelength of around 1.56 µm and including compressive-strained InGaAsP well (4.5 nm thick)/InGaAsP barrier (10 nm thick), a 130-nm-thick InGaAsP upper optical confinement layer, a 2-µm-thick p-InP cladding layer, and a 0.2-µm-thick $p^+$-InGaAs contact layer. A region of the SOA region 103 facing the collimating lens 106 is configured as an angled waveguide 140, and is bent by 5° with respect to a cleaved facet. An AR film 117 is formed on this facet, and the synergistic effect between the angled-facet waveguide 140 and the AR film 117 suppresses the facet reflectivity down to 0.01% or less. The phase adjustment region 107 includes an optical waveguide comprised of an InGaAsP bulk layer having a thickness of 337 nm and a composition wavelength of 1.3 µm. The SOA region 103 and the phase adjustment region 107 are coupled together by a butt joint.

The isolation trench 105 is formed by dry a etching in the optical waveguide region configured by a bulk layer, and has a depth of around 8 µm. As to the horizontal direction, the bent angle was 6° with respect to the waveguide of the phase adjustment region 107 and optical modulator/VOA region 104a. The isolation trench 105 was filled with UV-curable resin having a refractive index of 1.6, which was cured. In this structure, a trench distance dGap of 0.75 µm was employed, which achieved around 7% for the effective reflectivity toward the laser resonator, and 70% for the optical coupling coefficient of light emitted from the phase adjustment region 107 to the VOA region 104.

The optical modulator/VOA region 104a includes, consecutively from the bottom layer on the substrate, a 100-nm-thick InGaAsP lower optical confinement layer, a ten-layer-multiple-quantum-well active layer having a photoluminescence wavelength of around 1.55 µm and including compressive-strained InGaAsP well (5 nm thick)/InGaAsP barrier (10 nm thick), a 100-nm-thick InGaAsP upper optical confinement layer, a 2-µm-thick p-InP cladding layer, and a 0.2-µm-thick $p^+$-InGaAs contact layer. The optical modulator/VOA region 104a also configures an angled waveguide 140 in the area facing the emitting facet, and faces the cleaved facet while being angled by 15° with respect thereto. An AR film 117 is formed on this facet, and the contribution by the angled-facet waveguide 140 and AR film 117 suppressed the facet reflectivity down to 0.01% or less. In the present embodiment, the angle of the emitting facet of device is bent by 15°, i.e., the limit thereof. This is because, since the current-drive optical modulation also uses the optical amplification region (upon a bias at which the injected current is equal to or above transparent carrier density) of the optical modulator/VOA region 104a for modulation, the optical amplification incurs degradation of the modulation characteristic upon presence of the reflected return light, and accordingly it is preferable to suppress the reflected return light.

In the SOA region 103, phase adjustment region 107 and VOA region 104, a pad configured by Ti/Pt/Au electrode is formed as a p-electrode 108, whereas a Cr/Au electrode is formed as an n-electrode 109. In each region, a Ru-doped high-resistance current block 118 is formed as a current block layer, for achieving a smaller capacitance.

A collimating lens having a diameter of 2.5 mm was used as the collimating lens 106 which configures an external laser resonator outside the n-InP substrate 120. A filter configured by a liquid crystal was used as the wavelength filter 102. The transmission peak wavelength of this wavelength filter 102 can be tuned by changing the voltage applied to the filter, and is adjustable within a range between 1.53 µm and 1.57 µm. A total reflection mirror coated with a Au film was used as the optical reflector 101.

As in the case of the first exemplary embodiment, an optical module was manufactured which included the external-resonator-type semiconductor laser 100a having the configuration as described above, and a wavelength locker unit. The modulation characteristic obtained therein during operation at 30° C. was such that when a phase control was performed by using 150 mA for the injected current to the SOA region 103 and around 5 mA or less for the tuning current to the phase adjustment region 107, and the optical modulator/VOA region 104a was used for optical amplification, a wavelength tuning at a 50 GHz interval, a module optical output power of 10 mW and a side-mode-suppression ratio of 50 dB were obtained for an injected current of 80 mA and a tunable-wavelength range of 40 nm. In addition, as a current-drive optical-modulation characteristic of the optical modulator/VOA region 104a, a 10 Gbps-modualtion capability and a dynamic optical extinction ratio of 7 dB were obtained for a maximum of 80 mA drive current. In the structure of the present embodiment, the optical modulator/VOA region 104 and the phase adjustment region 107 are completely isolated from each other by the isolation trench 105, thus a high-level electric isolation by an electric resistance of 1MΩ between both the regions can be achieved, and also a higher thermal isolation is achieved therebetween. Thus, a superior characteristic could be achieved wherein such a large-amplitude current-drive modulation scarcely causes an adverse affect on the wavelength stability and mode stability.

Figure 16A:
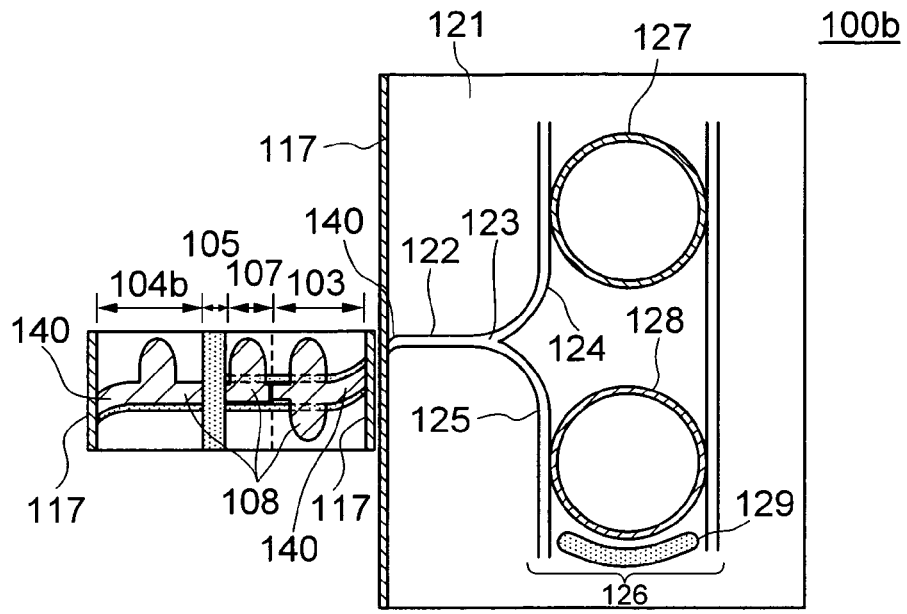
FIG. 16A is a schematic top plan view of an external-resonator-type wavelength-tunable laser according to a third exemplary embodiment of the present invention.
Figure 16B:
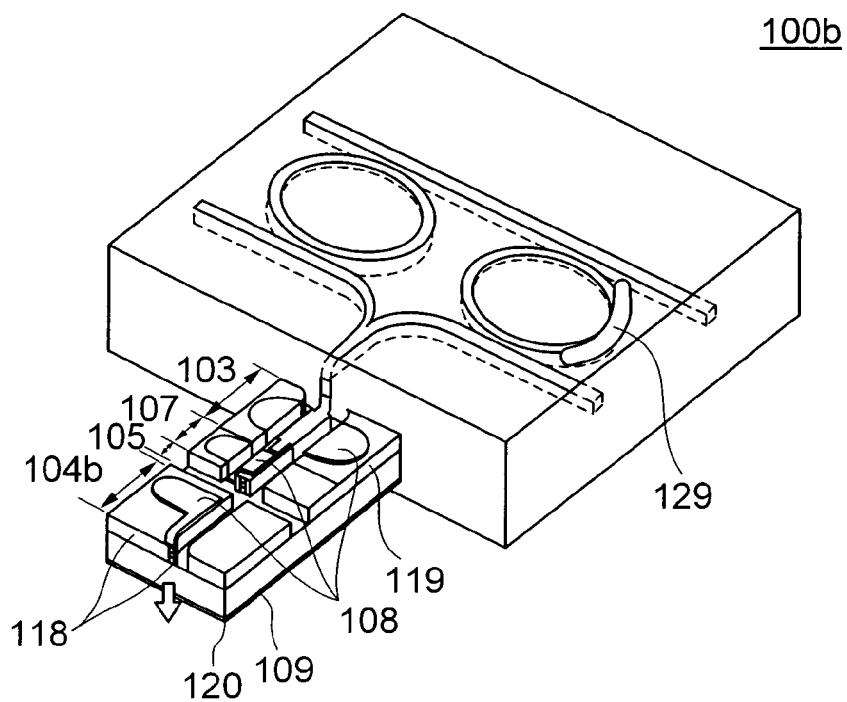
FIG. 16B is a perspective view thereof.

FIG. 16A schematically shows the top surface of an external-resonator-type wavelength-tunable semiconductor laser according to a third exemplary embodiment of the present invention, and FIG. 16B shows a perspective view thereof. The external-resonator-type wavelength-tunable semiconductor laser 100b includes a semiconductor optical amplifier (SOA) 103, a phase adjustment region 107, an isolation trench 105 and an optical modulator (MOD) 104b, which are monolithically integrated on an InP substrate 120, and a loop-type wavelength-tunable filter substrate 121 configured by quartz-based PLC. The present embodiment is different from the first exemplary embodiment in that the loop-type wavelength-tunable filter substrate 121 is used as the external resonator, and an optical modulator 104b is integrated on the InP substrate 120 instead of the VOA 104 (FIG. 13).

Each region on the InP substrate 120 is configured as described hereinafter. The semiconductor optical amplifier (SOA) 103 includes, consecutively from the bottom layer on the InP substrate 120, a 70-nm-thick InGaAsP lower optical confinement layer, a five-layer-multiple-quantum-well active layer having a photoluminescence wavelength of around 1.55 µm and including compressive-strained InGaAsP well (5 nm thick)/InGaAsP barrier (8 nm thick), a 70-nm-thick InGaAsP upper optical confinement layer, a 2-µm-thick p-InP cladding layer, and a 0.2-µm-thick p$^+$-InGaAs contact layer, and has a region length of 500 µm. A side of the waveguide of SOA region 103 near the loop-type wavelength-tunable filer substrate 121 is configured as an angled waveguide, and is bent by 10° with respect to a cleaved facet. An AR film 117 is formed on the facet, and the synergistic effect between the angled-facet waveguide and the AR film 117 suppressed the facet reflectivity down to 0.04% or less.

The 200-µm-long phase modulation region 107 includes an optical waveguide configured by an InGaAsP bulk layer having a thickness of 200 nm and a composition wavelength of 1.3 µm. The SOA region 103 and the phase adjustment region 107 are coupled together by a butt joint. The SOA region 103 and the phase adjustment region 107 are sufficiently electrically isolated from each other, wherein the isolation resistance is 10 kΩ or above, and an attention is paid so that both the currents do not interfere each other.

The isolation trench 105 is formed by dry etching in the optical waveguide region configured by a bulk layer, and has a depth of around 10 µm. The etched surface is substantially vertical at around 89.5°, and the horizontal direction is substantially vertical (without inclination) with respect to the waveguide of the phase adjustment region 107 and optical modulator region 104. The width of isolation trench 105 is 1.2 µm. The isolation trench 105 is filled with $SiO_2$, and refractive index nGap of the trench part is around 1.45. The isolation resistance between the phase adjustment region 107 and the optical modulator 104b is 1MΩ or above. The isolation trench 105 configured as above provided around 10% for the effective reflectivity toward the laser resonator, and around 70% for the coupling coefficient of the light emitted from the phase adjustment region 107 to the optical modulator region.

The optical modulator 104b has a layer structure different from that in the SOA region 103, and includes consecutively from the bottom layer on the substrate, a 40-nm-thick AlGaInAs optical confinement layer, a seven-layer-multiple-quantum-well active layer having a photoluminescence wavelength of around 1.48 µm and including compressive-strained AlGaInAs well (8 nm thick)/AlGaInAs barrier (8 nm thick), a 40-nm-thick AlGaInAs upper optical confinement layer, a 20-nm-thick AlInAs overflow prevention layer, a 2-µm-thick p-InP cladding layer, and a 0.2-µm-thick p$^+$-InGaAs contact layer, and has a region length of 200 µm. The optical waveguide on the emitting facet side of the optical modulator 104a is an angled waveguide 140, and is bent by 10° with respect to the cleaved facet. An AR film 117 is formed on this facet, and the contribution by the angled-facet waveguide and AR film 117 suppressed the facet reflectivity down to 0.04% or less.

In the SOA region 103, phase adjustment region 107 and VOA region 104, a pad configured by Ti/Pt/Au electrode is formed as a p-electrode 108, whereas a Cr/Au electrode is formed as an n-electrode 109. A Fe-doped InP high-resistance layer 119 is formed as a current block layer in each region.

Next, the loop-type wavelength-tunable filter substrate 121 configured by quartz-based PLC will be described. The loop-type wavelength-tunable filter substrate 121 is configured by a two-stage loop filter made of quartz-based PLC, and the substrate size is around 5 mm long and 5 mm wide. The SOA region 103 and the loop-type wavelength-tunable filter substrate 121 are coupled together with a butt joint, and the interval of butt joint between the SOA region 103 and the loop-type wavelength-tunable filter substrate 121 is several micrometers. The first port 122 of the loop-type wavelength-tunable filter substrate 121 on the side of SOA region 103 is bent with respect to the optical waveguide of SOA region 103, thereby configuring an angled waveguide 140. An AR film 117 is formed on the facet on the side of SOA region 103, thereby suppressing the reflected return light. Between the loop-type wavelength-tunable filter substrate 121 and the SOA region 103, there may be provided a collimating lens such as shown in FIG. 1. In this case, due to the resultant large interval between the external resonators, it is desired that the reflectance characteristic of the loop-type wavelength-tunable filter substrate 121 have a narrower bandwidth.

The loop-type wavelength-tunable filter substrate 121 has the first port optically coupled to a 1×2 Y-shaped optical splitter 223, to which a second port 124 and a third port 125 thereof are coupled. The second port 124 and third port 125 are coupled together in the shape of a loop, a midway point of which is provided with a first ring resonator 127 and a second ring resonator 128. The first ring resonator 127 and second ring resonator 128 are configured by optical ring resonators having different characteristics. The free spectral range (FSP) of first ring resonator 127 is set at FSR=50.0 GHz. The FSR of second ring resonator 128 is set at FSR=49.5 GHz. Finesse (ratio of transmission peak band to FSR) used here was 15.

The second port 124, third port 125, first ring resonator 127, and second ring resonator 128 configure a loop-type wavelength-tunable filter 126. These components are mounted on a common temperature controller (TEC, thermoelectric cooler) for a temperature control. Although not illustrated, the loop-type wavelength-tunable filter substrate 121 is provided with a thermistor for monitoring temperature, a PD (photodetector) for monitoring optical output power etc., which are disposed at a suitable location. A microheater 129 capable of changing the temperature of ring resonators is provided in the second ring resonator 128. The channel of first ring resonator 127 having a FSR of 50 GHz is matched with the standard channel of ITU.

An optical module was manufactured which included the external-resonator-type semiconductor laser 100b having the configuration as described above. A phase control was performed by using 200 mA for the injected current to the SOA region 103, and around 5 mA or less for the tuning current to the phase adjustment region 107, to measure the laser characteristic while using 0-2V for the applied voltage to the optical modulator 104b and around 80° for the range of temperature control of the resistance heater. The resultant characteristics were such that the tunable wavelength ranged 40 nm, the wavelength tuning was possible at a 50 GHz interval, and the side-mode-suppression ratio achieved was 50 dB. In addition, the optical extinction ratio was 13 dB upon optical modulation at 10 Gbps.

Figure 17A:
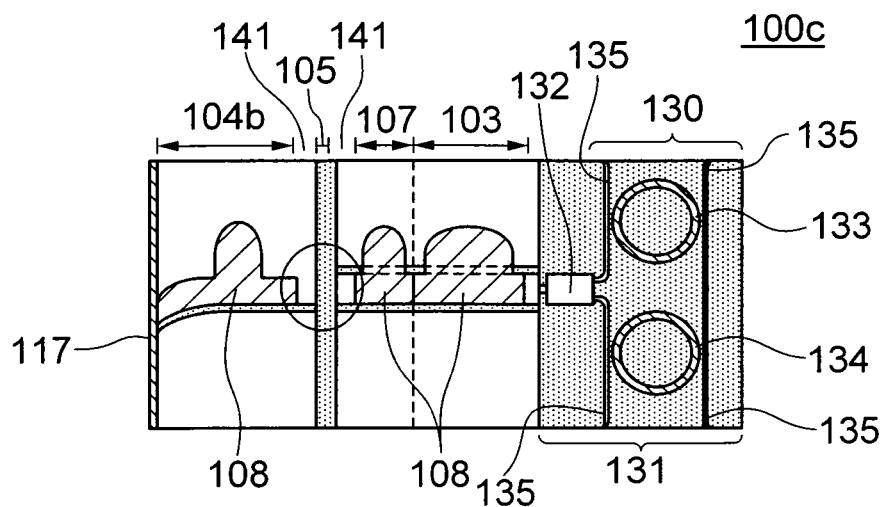
FIG. 17A is a schematic top plan view of a semiconductor laser according to a fourth exemplary embodiment of the present invention.
Figure 17B:
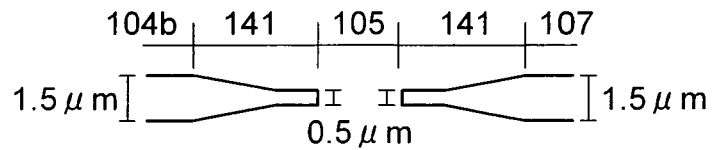
FIG. 17B is a schematic diagram showing the waveguide size therein.
Figure 18:
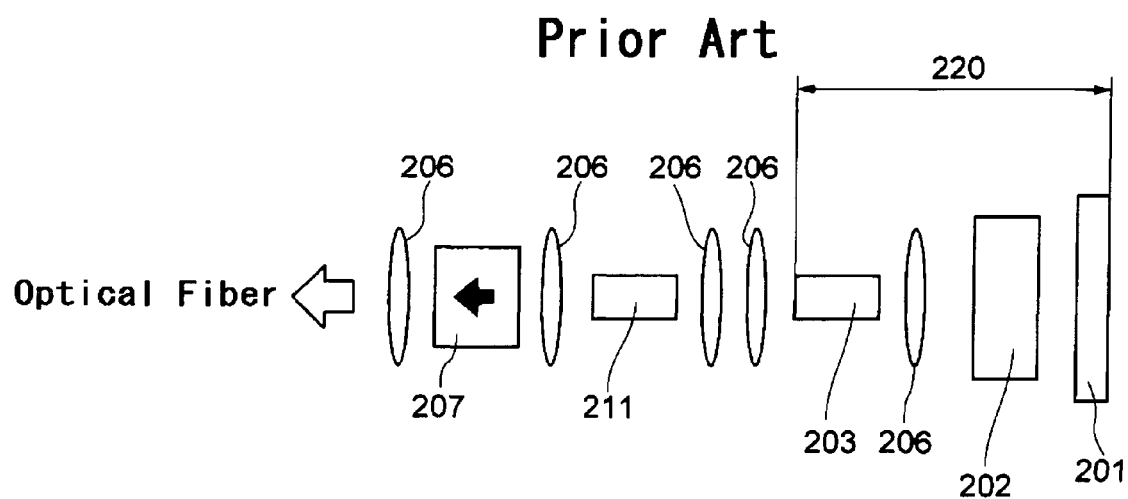
FIG. 18 is a schematic top plan view showing the configuration of a conventional semiconductor laser having an optical modulation function.
Figure 19:
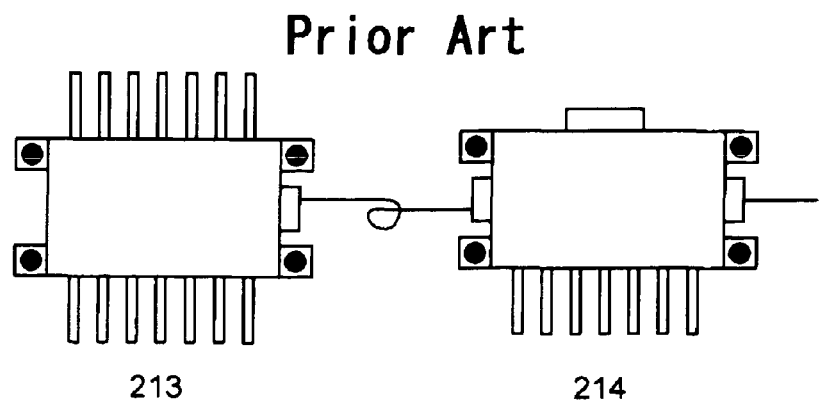
FIG. 19 is a schematic top plan view showing another example of the configuration of a conventional semiconductor laser having an optical modulation function.

FIG. 17A shows a wavelength-tunable semiconductor laser according to a fourth exemplary embodiment of the present invention, and FIG. 17B shows dimensions of the parts therein. In the present embodiment, a loop-type wavelength-tunable filter is monolithically integrated on an InP substrate 120. The present embodiment is different from the third exemplary embodiment in that all the loop-type wavelength-tunable filter 130, SOA region 103, phase adjustment region 107, and optical modulator (MOD) 104b configuring the wavelength-tunable semiconductor laser 100c are monolithically integrated on the same InP substrate 120. In the present embodiment, the optical waveguide of SOA region 103 and optical phase modulator 140b on the side of isolation trench 105 is provided with an optical-spot-size converter region 141, and the isolation trench 105 is filled with air.

The loop-type wavelength-tunable filter 130 includes a two-stage ring. The optical coupler/splitter 132 is configured as a multiple-mode interference-type optical coupler/splitter. The optical coupler/splitter 132 is equivalent to a 1×2 optical splitter 123 shown in FIG. 16, wherein a single waveguide part is connected to the waveguide of SOA region 103, and two waveguide parts are optically connected to optical ring resonators 133, 134 each configuring a loop-type wavelength-tunable filter 130. The optical coupler/splitter 132 and loop-type wavelength-tunable filter 130 are configured by a high-mesa waveguide, and are monolithically coupled to the SOA region 103, phase adjustment region 107 and optical modulator 104b, which include an embedded waveguide, with a butt joint. Such a connection between the embedded waveguide and the high-mesa waveguide is described in, for example, "M. Kohtoku et al., "Polarization Independent Semiconductor Arrayed Waveguide Grating Using a Deep-Ridge Waveguide Structure, IEICE Trans. Electron, vol. E81-C, No. 8, p. 1195, August 1998.", and thus the detailed description thereof is omitted herein.

In the present embodiment, the monolithic integration of the loop-type wavelength-tunable filter 130 and SOA region 103 employed therein provides a superior coupling between both the regions, and renders unnecessary the angled waveguide 140 and AR film 117, which are provided in the third exemplary embodiment for suppressing the reflected return light between both the regions. Measurement of the optical insertion loss between both the regions revealed 0.5 dB or less. Use of the semiconductor high-mesa waveguide for the ring resonator part in the present embodiment provides a large refractive-index difference between the waveguide core and the cladding, thereby reducing the curvature radius of the ring resonator compared to the third exemplary embodiment using a quartz-based PLC technique, and forming a small filter with a large FSR. As to the parameters of the ring resonator, the free spectral range (FSR) of first ring resonator 133 is set at FSR1=200 GHz, and the second FSR of second ring resonator 134 is set at FSR2=192.3 GHz. The Finesse (ratio of the transmission peak band to FSR) used herein was 22.

A Pt microheater capable of changing the temperature of ring resonators is provided on the waveguide of first and second ring resonators 133, 134. In the present embodiment, the ring diameter is smaller as compared to the third exemplary embodiment; however, the semiconductor waveguide has a 10-fold change rate of the refractive index with respect to the temperature change compared to the third exemplary embodiment using the quartz-based PLC, thereby providing a desired wavelength tuning under a lower temperature rise. It should be noted that the four optical waveguides 135 facing the substrate edge are formed as an angled waveguide, and are bent by 17° with respect to the substrate surface, and suppress the reflected return light. In the present embodiment, a wavelength locker unit is provided outside the laser in order to match the tuning wavelength with the standard channel of ITU.

Next, the spot-size conversion region 141 will be described. the waveguide of SOA region 103, phase adjustment region 107, and optical modulator 104b is formed to have a width of 1.5 μm. In the spot size conversion region 141, the waveguide is formed to have a taper shape so that the width of waveguide assumes 0.5 μm finally at the end of the isolation trench 105 on the side of isolation trench 105. The spot size obtained by this structure is around 10 μm. Corresponding to this optical spot size, the p-InP cladding layer, which is 2 μm thick in the second exemplary embodiment, is changed to have a 6 μm thickness. Thus, the amount of etching needed for forming the trench in the present embodiment is 12 μm, compared to 8 μm in the case of first and second exemplary embodiments. This range of increased depth does not impede the etching by an ICP etching; however, a further increase of the spot size necessitates a further increased thickness of the cladding, thereby incurring a concern such as an increased growth time for the cladding, degradation in the accuracy of the etched trench etc. Thus, we consider the upper limit of optical spot size is around 10 µm. As a result of introducing such a spot size conversion structure, the device length somewhat increases as a whole; however, the allowable margin for forming the isolation trench in the lengthwise direction can be increased. This resulted in a 2.75 µm width for the isolation trench including therein air medium, which allowed use of a stepper technique achieving a higher throughput in formation of the trench. 15° was employed for the θh which can reduce the relative reflectivity at most while suppressing the wave surface distortion, and 1 µm was used for the offset of waveguide.

The waveguide of spot size conversion region 141 employs a passive composition comparable to that of the phase adjustment region 107, and the isolation trench 105 is also formed in the passive region. This prevents a current from being injected to the portion facing the isolation trench 105, thereby achieving a superior characteristic in the long-life reliability.

The semiconductor laser 100c of the present embodiment is such that the length of optical modulator region 104b is 195 µm, the length of spot size conversion regions 141 on both sides of the isolation trench 105 is 100 µm, the distance of isolation trench 105 is 2.75 µm, the length of phase adjustment region 107 is 200 µm, the length of SOA region 103 is 400 µm, and the length of high mesa region 131 of the loop-type wavelength-tunable filter 130 is 500 µm, the total size of which is as small as 1500 µm long and 300 µm wide, and which are mounted on the same temperature controller (TEC, thermo-electric cooler) for the temperature control thereof. Although not illustrated, a thermistor for monitoring temperature, PD (photodetector) for monitoring the optical output power etc. are arranged in an appropriate position on the TEC.

Using the semiconductor laser 100c having the above configuration, laser characteristics were measured under the injected current to the SOA region 103 at 200 mA, the tuning current to the phase adjustment region 107 at around 10 mA or less, the applied voltage to the optical modulator 104b at 0-2V, and the control temperature for the Pt microheater at around 70° C. The results were such that the tunable-wavelength range was as wide as 40 nm, the wavelength tuning was possible at a 50 GHz interval, and the laser output power obtained on this occasion was 15 mW, and the side-mode-suppression ratio was 13 dB. In addition, an optical extinction ratio of 13 dB was obtained at a 10 Gbps optical modulation. As described heretofore, the present embodiment provides a higher output power, and smaller dimensions for the semiconductor laser compared to the second exemplary embodiment.

Although the third exemplary embodiment exemplifies use of a directional coupler at the coupling portion between the ring resonators 133, 134 and the waveguide 135, the embodiment is not limited to this configuration. Instead of the directional coupler, a multiple-mode interference coupler may also be used.

Although the present invention is described heretofore with reference to preferred embodiment thereof, the semiconductor laser, module and optical transmitter of the present invention are not limited only to the above exemplified embodiments, and a variety of alterations and modifications made therefrom may fall within the scope of the present invention.

The invention claimed is:

1. A semiconductor laser comprising first and second semiconductor optical waveguides formed on a semiconductor substrate and isolated from each other by an isolation trench, wherein:
   a facet pair including a facet of said first semiconductor optical waveguide adjacent to said isolation trench and a facet of said second semiconductor optical waveguide opposing said facet of said first semiconductor optical waveguide configures a composite optical reflector/connector, said isolation trench is filled with a medium having a refractive index lower than a refractive index of said semiconductor substrate and residing in a range between 1 and 2, and a wavelength filter is provided between said first optical waveguide and an optical reflector, which is combined with said first optical waveguide and said composite optical reflector/connector to configure an optical resonator,
   wherein:
   said first semiconductor optical waveguide includes a light-emitting facet, on which an antireflection film is formed, on a side counter to another facet opposing said second semiconductor optical waveguide, and is bent, in a vicinity of said light-emitting facet, by a range between 5° and 15° with respect to said light-emitting facet;
   said wavelength filter is a wavelength-tunable filter, which is an optical component disposed outside said semiconductor substrate; and
   said wavelength-tunable filter includes at least one of quartz-based PLC filter, Si waveguide filter, liquid crystal filter, and optical fiber grating filter.

2. A semiconductor laser comprising first and second semiconductor optical waveguides formed on a semiconductor substrate and isolated from each other by an isolation trench, wherein:
   a facet pair including a facet of said first semiconductor optical waveguide adjacent to said isolation trench and a facet of said second semiconductor optical waveguide opposing said facet of said first semiconductor optical waveguide configures a composite optical reflector/connector,
   said isolation trench is filled with a medium having a refractive index lower than a refractive index of said semiconductor substrate and residing in a range between 1 and 2, and
   a wavelength filter is provided between said first semiconductor optical waveguide and an optical reflector, which is combined with said first semiconductor optical waveguide and said composite optical reflector/connector to configure an optical resonator,
   wherein:
   said wavelength filter is a wavelength-tunable filter, which is an optical component disposed outside said semiconductor substrate, the length of the isolation trench dGap is equal to or less than 15 µm, and a spot size of light at emitting/receiving parts of the isolation trench is equal to or less than 10 µm, wherein a bent angle θh is a bent angle of said second semiconductor optical waveguide with respect to horizontal direction, a bent angle θv is a bent angle of said first semiconductor optical waveguide with respect to vertical direction . . . , and the bent angle θh is equal to or less than 10°,
   wherein said first semiconductor optical waveguide includes a light-emitting facet on which an antireflection film is formed, on a side counter to another facet opposing said second semiconductor optical waveguide, and is bent, in a vicinity of said light-emitting facet by a range between 5° and 15° with respect to said light-emitting facet.

3. A semiconductor laser according to claim 2, wherein said wavelength-tunable filter includes at least one of quartz-based PLC filter, Si waveguide filter, liquid crystal filter, and optical fiber grating filter.

4. A semiconductor laser according to claim 2, wherein said first semiconductor optical waveguide further has a phase adjustment function.

5. A semiconductor laser according to claim 2, wherein said composite optical reflector/connector has an effective reflectivity not lower than 1% and not higher than 30%, and an optical coupling coefficient not lower than 50%.

6. A semiconductor laser according to claim 2, wherein a length dGap of said isolation trench resides within a range of L±Λ/4, given Λ and L being a period of said effective reflectivity on said facet of said first semiconductor optical waveguide with respect to the length dGap of said isolation trench, and a length at which said effective reflectivity assumes a peak or bottom, respectively.

7. A semiconductor laser according to claim 2, wherein said facets configuring said facet pair are bent in the same direction by the bent angle θh, said bent angle θh being smaller than a total internal reflection angle of the light at each of said facets.

8. A semiconductor laser according to claim 7, wherein said first and second semiconductor optical waveguides are offset in location thereof from each other in a direction parallel to said main surface of said semiconductor substrate.

9. A semiconductor laser according to claim 2, wherein said first and second semiconductor optical waveguides each include, adjacent to said isolation trench, an optical waveguide region having a function of converting a spot size of light.

10. A semiconductor laser according to claim 2, wherein said isolation trench is formed by etching, and said facets configuring said facet pair are formed by said etching.

11. A semiconductor laser according to claim 2, wherein said first semiconductor optical waveguide has at least an optical amplification function and said second semiconductor optical waveguide has at least a light control function.

12. A semiconductor laser according to claim 11, wherein said light control function includes at least one of optical amplification function, optical modulation function, optical attenuation function, photoreception function, optical switch function, and optical coupling/splitting function.

13. A semiconductor laser according to claim 12, wherein said first semiconductor optical waveguide further has a phase adjustment function.

14. A semiconductor laser according to claim 12, wherein the second semiconductor optical waveguide is configured by a Mach-Zehnder optical modulator.

15. A semiconductor laser comprising first and second semiconductor optical waveguides formed on a semiconductor substrate and isolated from each other by an isolation trench, wherein:
a facet pair including a facet of said first semiconductor optical waveguide adjacent to said isolation trench and a facet of said second semiconductor optical waveguide opposing said facet of said first semiconductor optical waveguide configures a composite optical reflector/connector,
said isolation trench is filled with a medium having a refractive index lower than a refractive index of said semiconductor substrate and residing in a range between 1 and 2, and
a wavelength filter is provided between said first semiconductor optical waveguide and an optical reflector, which is combined with said first semiconductor optical waveguide and said composite optical reflector/connector to configure an optical resonator,
wherein said wavelength filter is a wavelength-tunable filter, which is an optical component disposed outside said semiconductor substrate, the length of the isolation trench dGap is equal to or less than 15 μm, and a spot size of light at emitting/receiving parts of the isolation trench is equal to or less than 10 μm, wherein a bent angle θh is a bent angle of the second semiconductor optical waveguide with respect to horizontal direction, a bent angle θv is a bent angle of the first semiconductor optical waveguide with respect to vertical direction, . . . , and the bent angle θh is equal to or less than 10°,
wherein an antireflection film is formed on a light-emitting facet of said second semiconductor optical waveguide far from said isolation trench, and is bent, in a vicinity of said light-emitting facet, by a range between 5° and 10° with respect to said light-emitting facet.

* * * * *

UNITED STATES PATENT AND TRADEMARK OFFICE
CERTIFICATE OF CORRECTION

PATENT NO. : 8,457,168 B2
APPLICATION NO. : 12/086287
DATED : June 4, 2013
INVENTOR(S) : Kudo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 529 days.

Signed and Sealed this
Eighth Day of September, 2015

Michelle K. Lee
*Director of the United States Patent and Trademark Office*